United States Patent
Saito et al.

(10) Patent No.: US 6,810,575 B1
(45) Date of Patent: Nov. 2, 2004

(54) FUNCTIONAL ELEMENT FOR ELECTRIC, ELECTRONIC OR OPTICAL DEVICE AND METHOD FOR MANUFACTURING THE SAME

(75) Inventors: Hidetoshi Saito, Nagaoka (JP); Minoru Sato, Nagaoka (JP); Yoshikazu Ueda, Nagaoka (JP); Hideo Kinoshita, Yokohama (JP)

(73) Assignee: Asahi Kasai Chemicals Corporation, Tokyo (JP)

( * ) Notice: Subject to any disclaimer, the term of this patent is extended or adjusted under 35 U.S.C. 154(b) by 0 days.

(21) Appl. No.: 09/647,489

(22) PCT Filed: Mar. 24, 1999

(86) PCT No.: PCT/JP99/01477

§ 371 (c)(1),
(2), (4) Date: Sep. 29, 2000

(87) PCT Pub. No.: WO99/57345

PCT Pub. Date: Nov. 11, 1999

(30) Foreign Application Priority Data

Apr. 30, 1998 (JP) .......................................... 10-134300
Sep. 24, 1998 (JP) .......................................... 10-285864
Sep. 24, 1998 (JP) .......................................... 10-285892

(51) Int. Cl.$^7$ ................... H01L 31/036; H01L 31/0352; H01G 9/26; H01H 35/00; B32B 3/10

(52) U.S. Cl. .................... 29/592.1; 29/25.01; 29/25.03; 29/622; 428/469; 428/472.1; 428/701

(58) Field of Search .............................. 428/469, 472.1, 428/701; 29/25.01, 25.03, 592.1, 622

(56) References Cited

U.S. PATENT DOCUMENTS

| | | | | |
|---|---|---|---|---|
| 4,307,507 A | * | 12/1981 | Gray et al. .......... | 148/DIG. 50 |
| 4,414,023 A | * | 11/1983 | Aggen et al. ................. | 420/40 |
| 4,448,485 A | * | 5/1984 | Bergman et al. ............ | 359/328 |
| 4,591,717 A | * | 5/1986 | Scherber ...................... | 250/330 |
| 5,017,007 A | * | 5/1991 | Milne et al. ................. | 356/301 |
| 5,055,145 A | * | 10/1991 | Ikegami et al. ............. | 148/285 |
| 5,140,393 A | * | 8/1992 | Hijikihigawa et al. . | 204/403.01 |
| 5,381,753 A | | 1/1995 | Okajima et al. | |
| 5,447,878 A | * | 9/1995 | Park et al. ..................... | 438/14 |
| 5,479,106 A | * | 12/1995 | Takahashi et al. .......... | 324/753 |
| 5,693,208 A | * | 12/1997 | Paulet ......................... | 205/139 |
| 5,811,917 A | * | 9/1998 | Sekinger et al. ............ | 313/336 |
| 5,993,715 A | * | 11/1999 | Park ............................ | 264/166 |

FOREIGN PATENT DOCUMENTS

| | | |
|---|---|---|
| JP | 506597 | 1/1975 |
| JP | A62091500 | 4/1987 |
| JP | A63181305 | 7/1988 |
| JP | A01225382 | 9/1989 |
| JP | A02237070 | 9/1990 |
| JP | A03181337 | 8/1991 |
| JP | A05306200 | 11/1993 |

* cited by examiner

Primary Examiner—Deborah Jones
Assistant Examiner—Jason Savage
(74) Attorney, Agent, or Firm—Birch, Stewart, Kolasch & Birch, LLP

(57) ABSTRACT

Disclosed is a functional element for use in an electric, an electronic or an optical device, and a method for producing the same. The functional element comprises a substrate having on an upper surface thereof a plurality of metal oxide needles extending upwardly of the upper surface of the substrate, with their respective central axes arranged substantially in parallel with each other, wherein the needles have a specific average circle-based diameter and a specific average aspect ratio, and wherein the needles are present at a specific density at the upper surface of the substrate. Also disclosed is a method for producing the functional element, which comprises gasifying a metal compound having the capability to react with an oxide-forming substance to form a metal oxide, to thereby obtain a metal compound gas, and applying the obtained metal compound gas onto a surface of a substrate which is placed in a reaction zone containing the oxide-forming substance and which is heated to a temperature higher than the temperature of the metal compound gas.

11 Claims, 6 Drawing Sheets

100 μm

100 μm

1 μm

10 μm

1 μm

———  1 μm

———  100 μm

———— 1 μm

FUNCTIONAL ELEMENT FOR ELECTRIC, ELECTRONIC OR OPTICAL DEVICE AND METHOD FOR MANUFACTURING THE SAME

This application is the national phase under 35 U.S.C. § 371 of PCT International Application No. PCT/JP99/01477 which has an International filing date of Mar. 24, 1999, which designated the United States of America.

BACKGROUND OF THE INVENTION

1. Field of the Invention

The present invention relates to a functional element for use in an electric, an electronic or an optical device. More particularly, the present invention is concerned with a functional element for use in an electric, electronic or an optical device, comprising a substrate having on an upper surface thereof a plurality of metal oxide needles extending upwardly of the upper surface of the substrate, with their respective central axes arranged substantially in parallel with each other, wherein the metal oxide needles have a specific weighted average circle-based diameter and a specific weighted average aspect ratio, and wherein the metal oxide needles are present at a specific density at the upper surface of the substrate. The present invention is also concerned with a method for producing the above-mentioned functional element. The functional element of the present invention has an advantage in that, although the metal oxide structure therein comprised of the needles has a very large surface area, the metal oxide structure has a very small thickness. Therefore, the functional element of the present invention can be very advantageously used as a component for an electric, an electronic or an optical device.

2. Prior Art

Metal oxides have various functional properties. By virtue of such various functional properties, metal oxides have been used in various fields. For example, metal oxides are used as components for an electric or an electronic device, such as a ceramic capacitor (making use of ferroelectric properties), a gas sensor (making use of resistance properties), and a magnetic tape and a magnetic head (making use of magnetic properties). Further, in recent years, studies have been being made for using metal oxides as components for optical devices, for example, an optical switch (making use of optical waveguide properties) and an ultraviolet laser emission element (making use of light emission properties).

In general, the metal oxides used as components for an electric, an electronic or an optical device have a morphology containing a flat surface. For example, in a ceramic capacitor, a metal oxide having ferroelectric properties (such as barium titanate) is used in the form of a laminate wherein the metal oxide is sandwiched between two flat electrodes. Further, in a magnetic tape, a metal oxide (such as chromium oxide) is used in the form of a film formed on a polymer film. With respect to the various uses of the metal oxides, it should be noted that, in some uses, the performance of the component employing a metal oxide can be greatly improved by increasing the surface area of the metal oxide employed. For example, in the case of a ceramic capacitor mentioned above, the most important property thereof is its capacitance. In the capacitor, a larger capacitance means an improved performance of the capacitor. The capacitance of the capacitor is proportional to the surface area of the metal oxide used therein, and inversely proportional to the thickness of the metal oxide. That is, the larger the surface area of the metal oxide, the larger the capacitance of the capacitor, and, in addition, the thinner the metal oxide, the larger the capacitance of the capacitor. Because of these characteristics of a metal oxide, most of the conventional ceramic capacitors on the market are prepared by laminating approximately 100 layers comprising electrode layers and metal oxide layers. That is, in a conventional capacitor, a high capacitance is obtained by a method in which the surface area of a metal oxide is increased by increasing the number of metal oxide layers, whereas the thicknesses of the electrode layers and the metal oxide layers are reduced to as small a value as possible. However, in the preparation of a capacitor, lamination of a large number of electrode layers and metal oxide layers is very difficult from the viewpoint of productivity and economy.

Such a problem would be able to be solved if it becomes possible to realize, for example, a capacitor containing only one metal oxide layer, wherein the metal oxide layer, on one hand, has a small thickness not larger than the total thickness of the large number of metal oxide layers of a conventional capacitor, and, on the other hand, has a large surface area (and hence a large capacitance) which is the same as or larger than the total surface area of the metal oxide layers of the conventional capacitor. Such a capacitor containing only one metal oxide layer is advantageous not only in that the productivity of the capacitor becomes high and the production cost becomes low, as compared to those of a conventional capacitor containing a large number of metal oxide layers, but also in that the capacitance of the capacitor can be easily increased.

As explained hereinabove by taking as one example the case of the capacitor, the development of a metal oxide structure having a large surface area while maintaining a small thickness will enable the production of an improved component for an electric, an electronic or an optical device. In addition, such a metal oxide structure is also expected to enable the development of new types of devices which can be used for producing new types of equipment.

As a method for producing a metal oxide structure having a large surface area, there is known a method in which whiskers comprised of metal oxide needles are formed. For example, Unexamined Japanese Patent Application Laid-Open Specification No. 50-6597 discloses a method for producing zinc oxide whiskers, in which a zinc alloy (comprising zinc and a metal having a boiling point higher than that of zinc) or a mixture of these two metals is heated under an oxygen-containing atmosphere in the presence of a substrate, to thereby form whiskers comprised of zinc oxide needles on the surface of the substrate. In this prior art technique, the formed zinc oxide whiskers are cut off from the substrate and provided for use as reinforcements for resins, ceramics and the like, and as semiconductors. However, in this prior art document, there is no disclosure suggesting that a structure comprising a substrate and whiskers formed thereon is used as a component for an electric or an electronic device or a component for an optical device.

In addition, there is a report that nanocrystals of ZnO formed on the surface of a substrate are used as an ultraviolet laser emission element (see "Kotai Butsuri (Solid State Physics)", vol. 33, no. 1, pp. 59–64 (1998)). The nanocrystals of ZnO formed on the surface of a substrate each have a height of 5 nm and a circle-based diameter of 100 nm. That is, the ratio of the length of the crystal to the circle-based diameter of the cross-section thereof (length/circle-based diameter of cross-section) is as small as 0.05. Therefore, in this technique, the surface area of a metal oxide cannot be greatly increased unless the thickness of the metal oxide is greatly increased.

SUMMARY OF THE INVENTION

In this situation, the present inventors have made extensive and intensive studies with a view toward developing a functional element for use in an electric, an electronic or an optical device, which comprises a substrate having a metal oxide structure formed on a surface thereof, wherein the metal oxide structure, on one hand, has a large surface area and, on the other hand, has a small thickness. As a result, the present inventors have successfully developed a functional element, which has been found to have excellent characteristics in that, although the metal oxide structure comprised of the needles has a very small thickness, the metal oxide structure has an extremely large surface area. Specifically, the functional element comprises a substrate having on an upper surface thereof a plurality of metal oxide needles extending upwardly of the upper surface of the substrate, with their respective central axes arranged substantially in parallel with each other, wherein the needles have a weighted average circle-based diameter of from 0.01 to 10,000 $\mu$m and a weighted average aspect ratio of 0.1 or more and wherein the needles are present at a density of from 0.01 to 10,000 needles per unit area having a size of 10 $\mu$m×10 $\mu$m at the upper surface of the substrate. The present inventors have also found that the above-mentioned functional element can be advantageously applied to various fields including the fields of elements for use in electric or electronic devices, such as an electron emission element of energy saving type (i.e., an electron emission element having the capability of emitting electrons even under low voltages), a high-capacitance capacitor element, a high-density memory element and a high-sensitivity sensor element; and the fields of elements for use in optical devices, such as a laser emission element (particularly a laser emission element emitting a small wavelength laser, such as an ultraviolet laser) and a highly integrated optical switch element. Based on the above findings, the present invention has been completed.

Accordingly, it is an object of the present invention to provide a functional element for use in an electric, an electronic or an optical device, which comprises a substrate having a metal oxide structure formed on a surface thereof and has excellent characteristics in that the metal oxide structure, on one hand, has a large surface area and, on the other hand, a small thickness, so that the functional element can be very advantageously used as various types of high performance components for an electric, an electronic or an optical device.

It is another object of the present invention to provide a method for effectively and efficiently producing the above-mentioned functional element.

The foregoing and other objects, features and advantages of the present invention will be apparent from the following detailed description and appended claims taken in connection with the accompanying drawings.

DESCRIPTION OF REFERENCE NUMERALS

Figure 1:
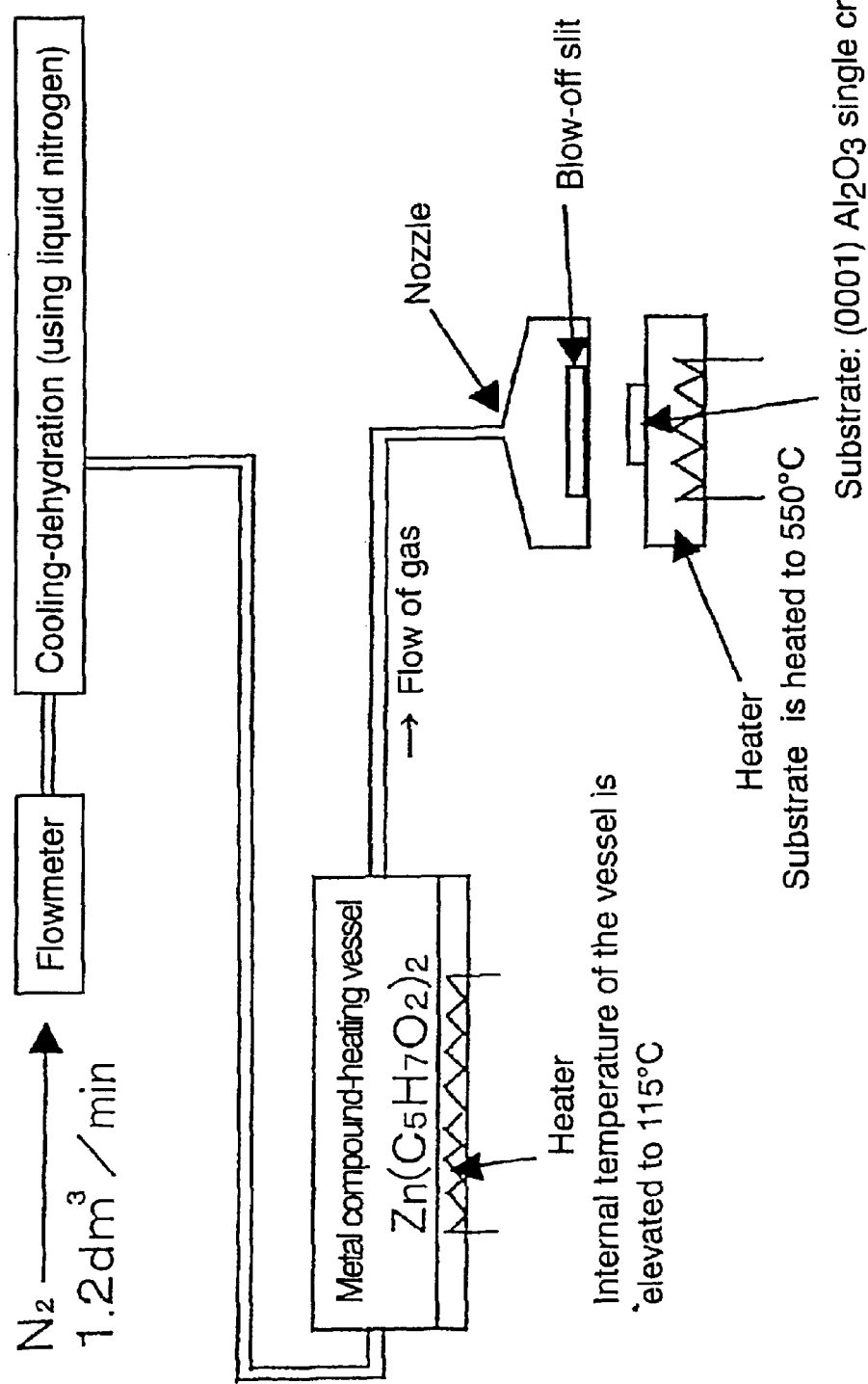
FIG. 1 is a diagram showing a preferred example of production systems usable for producing the functional element of the present invention.

1: Substrate ($Al_2O_3$)
2: Metal oxide needles (ZnO)
3: Nickel (Ni) electrode formed by sputtering
4 and 8: Copper plate
5: Insulating film
6: Silicon (Si) plate
7: Electroconductive paste

DETAILED DESCRIPTION OF THE INVENTION

In one aspect of the present invention, there is provided a functional element for use in an electric, an electronic or an optical device, comprising a substrate having on an upper surface thereof a plurality of metal oxide needles extending upwardly of the upper surface of the substrate, with their respective central axes arranged substantially in parallel with each other, wherein the metal oxide needles have a weighted average circle-based diameter of from 0.01 to 10,000 $\mu$m, wherein the weighted average circle-based diameter is defined as the weighted average diameter of circles having areas equal to the areas of the cross-sections of the needles, the cross-sections being taken at the middle portions located at the ½ lengths of the needles and along a plane perpendicular to the central axes of the metal oxide needles, wherein the metal oxide needles have a weighted average aspect ratio of 0.1 or more, wherein the weighted average aspect ratio is defined as the ratio of the weighted average length of the needles to the weighted average circle-based diameter of the needles, and wherein the metal oxide needles are present at a density of from 0.01 to 10,000 needles per unit area having a size of 10 $\mu$m×10 $\mu$m at the upper surface of the substrate.

In another aspect of the present invention, there is provided a method for producing a functional element for use in an electric, an electronic or an optical device, which comprises:

(a) gasifying at least one metal compound having volatilizability or sublimability and having the capability to react with at least one oxide-forming substance to form a metal oxide corresponding to the metal compound, to thereby obtain a metal compound gas, and (b) applying the obtained metal compound gas onto a surface of a substrate which is placed in a reaction zone containing the oxide-forming substance and which is heated to a temperature higher than the temperature of the metal compound gas, to thereby contact the surface of the substrate with the metal compound gas in the presence of the oxide-forming substance for a period of time sufficient to grow a plurality of metal oxide needles on the surface of the substrate and form the functional element of the present invention.

For easy understanding of the present invention, the essential features and various preferred embodiments of the present invention are enumerated below.

1. A functional element for use in an electric, an electronic or an optical device, comprising:

a substrate having on an upper surface thereof a plurality of metal oxide needles extending upwardly of the upper surface of the substrate, with their respective central axes arranged substantially in parallel with each other, the needles having a weighted average circle-based diameter of from 0.01 to 10,000 μm, wherein the weighted average circle-based diameter is defined as the weighted average diameter of circles having areas equal to the areas of the cross-sections of the needles, the cross-sections being taken at the middle portions located at the ½ lengths of the needles and along a plane perpendicular to the central axes of the needles, the needles having a weighted average aspect ratio of 0.1 or more, wherein the weighted average aspect ratio is defined as the ratio of the weighted average length of the needles to the weighted average circle-based diameter of the needles, the needles being present at a density of from 0.01 to 10,000 needles per unit area having a size of 10 μm×10 μm at the upper surface of the substrate.

2. The functional element according to item 1 above, wherein the metal oxide needles are secured to each other by means of at least one substance selected from the group consisting of an organic substance, an inorganic substance and a metal.

3. The functional element according to item 1 above, which is an electron emission element for use in an electric or an electronic device.

4. The functional element according to item 1 above, which is a capacitor element for use in an electric or an electronic device.

5. The functional element according to item 1 above, which is a memory element for use in an electric or an electronic device.

6. The functional element according to item 1 above, which is a sensor element for use in an electric or an electronic device.

7. The functional element according to item 1 above, which is a laser emission element for use in an optical device.

8. The functional element according to item 1 above, which is an optical switch element for use in an optical device.

9. A method for producing a functional element for use in an electric, an electronic or an optical device, which comprises:

(a) gasifying at least one metal compound having volatilizability or sublimability and having the capability to react with at least one oxide-forming substance to form a metal oxide corresponding to the metal compound, to thereby obtain a metal compound gas, and (b) applying the obtained metal compound gas onto a surface of a substrate which is placed in a reaction zone containing the oxide-forming substance and which is heated to a temperature higher than the temperature of the metal compound gas, to thereby contact the surface of the substrate with the metal compound gas in the presence of the oxide-forming substance for a period of time sufficient to grow a plurality of metal oxide needles on the surface of the substrate and form the functional element of item 1 above.

10. The method according to item 9 above, wherein, in step (b), the metal compound gas is applied together with a carrier gas.

11. The method according to item 9 above, wherein the reaction zone contains air at atmospheric pressure.

12. The method according to item 9 above, wherein the metal moiety of the metal compound is comprised of at least one element selected from the group consisting of elements belonging to Groups 1 to 15 of the Periodic Table, exclusive of hydrogen, boron, carbon, nitrogen, phosphorus and arsenic.

13. The method according to item 9 above, wherein the metal moiety of the metal compound is comprised of at least one element selected from the group consisting of zinc, silicon, aluminum, tin, titanium, zirconium and lead.

Hereinbelow, the present invention will be described in detail.

First, an explanation is made with respect to the functional element of the present invention for use in an electric, an electronic or an optical device.

The functional element of the present invention comprises a substrate having on an upper surface thereof a plurality of metal oxide needles (i.e., metal oxide whiskers) extending upwardly of the upper surface of the substrate, with their respective central axes arranged substantially in parallel with each other. The metal oxide needles may have various morphologies, such as a cone-shaped protrusion, a rod, a prism and the like. With respect to the thickness of the metal oxide needles, it is preferred that the metal oxide needles have a weighted average circle-based diameter of from 0.01 to 10,000 μm, more advantageously from 0.01 to 100 μm, most advantageously from 0.1 to 10 μm. The weighted average circle-based diameter is defined as the weighted average diameter of circles having areas equal to the areas of the cross-sections of the needles, the cross-sections being taken along planes perpendicular to the central axes of the needles, at the middle portions located at the ½ lengths of the needles. Specifically, the weighted average circle-based diameter is calculated as follows. The area of the cross-section of a needle is calculated by a conventional method, such as an image analysis. The obtained area of the cross-section is divided by the circular constant π, and, with respect to the resultant value, a square root thereof is obtained. By doubling the obtained square root value, a circle-based diameter of the needle is obtained. Based on the obtained circle-based diameters of the needles, the weighted average circle-based diameter is obtained. When the weighted average circle-based diameter of the metal oxide needles is less than 0.01 μm, it is difficult to stably grow the metal oxide needles on the surface of the substrate. When the weighted average circle-based diameter is more than 10,000 μm, the desired effect of the surface area increase cannot be satisfactorily achieved by the metal oxide needles.

The metal oxide needles have a weighted average aspect ratio (hereinafter, frequently referred to simply as an "aspect ratio") of 0.1 or more, preferably 0.5 or more, more preferably 1.0 or more, wherein the aspect ratio is defined as the ratio of the weighted average length of the needles to the weighted average circle-based diameter of the needles. When the aspect ratio is less than 0.1, the effect of the surface area increase cannot be achieved by the metal oxide needles. The aspect ratio is preferably 100,000 or less, more preferably 10,000 or less, still more preferably 1,000 or less.

With respect to the weighted average length of the metal oxide needles, there is no particular limitation. The desired weighted average length of the metal oxide needles varies depending on the use of the functional element. However, in general, the weighted average length of the metal oxide needles is preferably from 0.1 to 10,000 µm, more preferably from 1 to 1,000 µm. When the weighted average length is less than 0.1 µm, the effect of the surface area increase cannot be satisfactorily achieved by the metal oxide needles. When the weighted average length is more than 10,000 µm, it is difficult for the functional element to have a satisfactory strength. However, even when the weighted average length is more than 10,000 µm, as described below, a satisfactory strength of the functional element can be achieved by securing the metal oxide needles to each other by means of an organic substance, an inorganic substance or the like.

In the present invention, with respect to the metal oxide needles, the weighted average circle-based diameter, the weighted average length and the weighted average aspect ratio are obtained, based on an SEM observation which is made by the following method. First, with respect to a sample of the functional element, the sample is substantially vertically cut along a plane including the center of the upper surface of the sample and extending in parallel to the longitudinal axis of a certain metal oxide needle, to thereby obtain a cut sample in which a substantially vertical cross-section of the substrate of the functional element is exposed. The cut sample is observed through an SEM, in which the direction of view is toward the cross-section of the substrate. The observation is made with respect to the field of view which extends over 100 µm on both sides of the above-mentioned center of the upper surface of the sample (200 µm in total) as viewed on the cross-section of the substrate. Only the metal oxide needles each exhibiting a completely observable profile (i.e., only the needles each allowing an observation of a complete profile thereof without being obstructed by other needles) are selected. The weighted average circle-based diameter and the weighted average length of the selected metal oxide needles are obtained. The weighted average aspect ratio of the metal oxide needles is obtained as the ratio of the weighted average length of the needles-to the weighted average circle-based diameter of the needles.

With respect to the morphology of the metal oxide needles, there is no particular limitation as long as the aspect ratio of the metal oxide needles is 0.1 or more. For example, when the metal oxide needle is of a rod shape, the detailed morphology of the rod-shaped needle is not particularly limited. Examples of detailed morphologies of the rod-shaped needle include: a morphology wherein the needle has a diameter which is uniform throughout the entire length thereof; a morphology wherein the needle has a diameter which is uniform from a lower end thereof to an intermediate portion of the length thereof; a morphology wherein the needle has a diameter which increases from a lower end thereof to an intermediate portion of the length thereof and which gradually decreases from the intermediate portion of the length thereof to an upper end thereof; a morphology wherein the needle has a diameter which gradually decreases from a lower end thereof to an upper end thereof; and a morphology wherein the upper end portion of the needle has the morphology of a pyramid, a truncated pyramid, a circular cone, a truncated circular cone or a hemisphere. When the needle has the morphology of a prism, the specific form of the prism may vary depending on the crystal structure of the metal oxide. For example, when the metal oxide is zinc oxide, the metal oxide needle tends to have the morphology of a hexagonal prism. When the metal oxide is aluminum oxide, the metal oxide needle tends to have the morphology of a quadrilateral or a hexagonal prism. When the metal oxide is titanium oxide, the metal oxide needle tends to have the morphology of a quadrilateral prism. The metal oxide needle may have the morphology of a polygonal prism other than quadrilateral and hexagonal prisms.

There is no particular limitation with respect, to the morphology of an upper end of the metal oxide needle. When the needle has a flat surface at an upper end thereof, the upper end portion of the needle has the morphology of, for example, a truncated circular cone, a truncated pyramid or the like. When an upper end of the needle forms a line or lines like a ridgeline or ridgelines, the upper end portion of the needle has a morphology comprising two or more planes wherein adjacent planes are connected with each other through a side or sides as the ridgeline or ridgelines. When the needle is pointed at an upper end thereof, the upper end portion of the needle has the morphology of a pyramid, a circular cone or the like. The preferred morphology of an upper end of the metal oxide needle varies depending on the use of the functional element. For example, when the functional element of the present invention is used as an electron emission element, it is preferred that the metal oxide needles have pointed upper ends, since such needles can easily emit electrons. It is a well-known phenomenon that a lightning conductor rod, which has a pointed tip, can be easily hit by a stroke of lightning. Further, the present inventors have confirmed that, when a voltage is applied to an object in order to cause the object to emit electrons, the emission of electrons also can be achieved easily in the case where the object has a pointed tip (i.e., a circular cone-shaped tip), as compared to the case where the object has a non-pointed tip.

In the functional element of the present invention, it is required that the metal oxide needles extend upwardly of an upper surface of the substrate, with their respective central axes (crystal axes extending in the longitudinal direction, when the needles are crystals) arranged substantially in parallel with each other. It is preferred that the needles have substantially the same length. For example, in the case where the functional element of the present invention is an electron emission element for use in an electric or an electronic device, the functional element has the high ability to emit electrons when the respective central axes of the needles are arranged substantially in parallel with each other, as compared to the electron emission ability obtained when the respective central axes of the needles are not arranged substantially in parallel with each other. The reason for this is as follows. If the respective central axes of the needles are not arranged in parallel with each other, the needles have different heights. If the needles have different heights, needles having a smaller height do not emit electrons and only needles having a larger height emit electrons from their upper ends. When the metal oxide needles have their respective central axes arranged substantially in parallel with each other, the number of tips capable of emitting electrons is likely to be increased, so that the capability of the functional element to emit electrons is increased, leading to an improvement in the electron emission ability. Further, when the metal oxide needle has the morphology of a prism, it is preferred that mutually opposite faces of the prism have portions which are in parallel with each other. For example, in the case where the functional element of the present invention is a laser emission element for use in an optical device, when mutually opposite faces of the prism-shaped needle have portions which are in parallel with each other, the functional element has the higher ability to emit laser.

Examples of materials for the substrate of the functional element include single crystals of metal oxides (such as aluminum oxide), single crystals of semiconductors, ceramics, silicon, metals (such as Fe and Ni), glasses and plastics. With respect to the thickness of the substrate, there is no particular limitation; however, it is preferred that the substrate has a thickness of from 10 μm to 100 mm. A substrate for use in the functional element of the present invention can be prepared by, for example, a method in which a commercially available product of any desired one of the above-mentioned materials is obtained, and the obtained product is cut and, if desired, subjected to a secondary processing. With respect to each of the morphology and size of the substrate, there is no particular limitation as long as the substrate has a substantially flat surface suitable for growing the metal oxide needles thereon. The morphology of the substrate is not particularly limited, and any of various morphologies can be employed, such as a plate and a prism (such as a rectangular or a triangular prism). Further, the desired size of the substrate largely varies depending on the use of the functional element, and a substrate having any desired size can be used. (For example, the magnitude of the dimensions determining the size of the substrate may be on the order of several tens of meters or may be on the order of millimeters.)

In the functional element of the present invention, the metal oxide needles are present at a density of from 0.01 to 10,000 needles per unit area having a size of 10 μm×10 μm at the upper surface of the substrate. The density of the needles is preferably from 0.1 to 10,000 needles, more preferably from 1 to 10,000 needles. When the density of the needles is less than 0.01 needle, the effect of the surface area increase is not satisfactory. The higher the density of the needles, the larger the surface area of the metal oxide needles. However, when the density is more than 10,000 needles, the thickness of each of the metal oxide needles must be reduced, so that the metal oxide needles cannot have a sufficient strength for practical use.

With respect to the metal moiety of the metal oxide needles of the functional element of the present invention, it is preferred that the metal moiety is comprised of at least one element selected from the group consisting of elements belonging to Groups 1 to 15 of the Periodic Table, exclusive of hydrogen (belonging to Group 1), boron (belonging to Group 13), carbon (belonging to Group 14), nitrogen (belonging to Group 15), phosphorus (belonging to Group 15) and arsenic (belonging to Group 15). Specific examples of such metals include Li, Na, K, Rb, Cs, Be, Mg, Ca, Sr, Ba, Al, Ga, In, Tl, Si, Ge, Sn, Pb, Sb, Bi, Sc, Y, La, Th, Ce, Pr, Nd, Pm, Sm, Eu, Gd, Tb, Dy, Ho, Er, Tm, Yb, Lu, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd and Hg, each of which can constitute at least a part of the metal moiety of the metal oxide. Of these metals, preferred are Li, Na, K, Rb, Cs, Be, Mg, Ca, Sr, Ba, Al, Ga, In, Tl, Si, Ge, Sn, Pb, Sb, Bi, Sc, Y, La, Ce, Th, Ti, Zr, V, Nb, Ta, Cr, Mo, W, Mn, Re, Fe, Ru, Os, Co, Rh, Ir, Ni, Pd, Pt, Cu, Ag, Au, Zn, Cd and Hg. More preferred are Li, K, Mg, Ca, Sr, Ba, Al, In, Si, Sn, Pb, Th, Y, Ce, Ti, Zr, V, Nb, Ta, Cr, Mo, W, Mn, Fe, Co, Ni, Pd, Pt, Cu, Ag, Zn and Cd. Still more preferred are Si, Al, Sn, Ti, Zr, Pb and Zn, since, when Si, Al, Sn, Ti, Zr, Pb or Zn constitutes at least a part of the metal moiety of the metal oxide, the functional element of the present invention is especially suitable for use in an electric, an electronic or an optical device. The above-mentioned metals can be used individually or in combination. Specific examples of metal oxides include MgO, $Al_2O_3$, $In_2O_3$, $SiO_2$, $SnO_2$, $TiO_2$, ZnO, barium titanate, $SrTiO_3$, PZT, YBCO, YSZ, YAG and ITO ($In_2O_3/SnO_2$, i.e., indium tin oxide). Further, an alkali metal can be used in combination with another metal, such as Ta or Nb. The combinations of an alkali metal with Ta or Nb can be used in the form of compound oxides, such as $LiNiO_3$, $KTaO_3$ and $NbLiO_3$.

The metal oxide needles of the functional element of the present invention may or may not be crystalline; however, it is preferred that the metal oxide needles are crystalline. When the metal oxide needle is crystalline, the crystalline form of the metal oxide needle may be any form selected from the group consisting of a single crystal, a combination of two or more single crystals, a polycrystal, a semicrystal having both a noncrystalline portion and a crystalline portion, and a mixture thereof. Of these crystals, a single crystal is especially preferred.

When two or more types of metal oxides are used, these metal oxides may be mixed with each other to form a single layer, or may be in the form of a laminate composed of different metal oxide layers.

The functional element of the present invention is comprised mainly of a substrate having on an upper surface thereof a plurality of metal oxide needles extending upwardly of the upper surface of the substrate. However, depending on the production conditions of the functional element, a flat film of a metal oxide may be formed between the substrate and the metal oxide needles. That is, it is possible that the functional element has a structure wherein a film of a metal oxide is formed on an upper surface of the substrate, and metal oxide needles are grown on and extend upwardly of the metal oxide film. The functional element of the present invention may have such a structure.

Hereinbelow, an explanation is made with respect to a preferred method for producing the functional element of the present invention for use in an electric, an electronic or an optical device.

The functional element of the present invention can be produced by a method which comprises gasifying a metal compound as a raw material for the metal oxide needles to thereby obtain a metal compound gas, and contacting the obtained metal compound gas with a substrate in the presence of an oxide-forming substance. More particularly, the functional element of the present invention can be produced by a method which comprises: gasifying at least one metal compound having volatilizability or sublimability and having the capability to react with an oxide-form substance to form a metal oxide, to thereby obtain a metal compound gas; and applying the obtained metal compound gas onto a surface of a substrate through a nozzle or the like, thereby contacting the surface of the substrate with the metal compound gas in the presence of the oxide-forming substance so that a plurality of metal oxide needles can grow on the surface of the substrate. In the present invention, the term oxide-forming substances means a substance which is capable of reacting with a metal compound as a raw material for metal oxide needles, to form a metal oxide finally, wherein the oxide-forming substance is a substance which reacts with the metal compound in the first stage. For example, when zinc acetylacetonate ($Zn(C_5H_7O_2)_2$), which is a metal compound, is reacted with water ($H_2O$), an oxide (ZnO) can be finally formed through a reaction route which is presumed to be comprised of a two-step reaction represented by the following formulae:

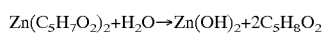

and

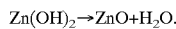

As can be seen from the above, water is an example of the oxide-forming substance used in the present invention.

In the production of the functional element of the present invention, for growing a plurality of metal oxide needles on a surface of a substrate, it is required that the application of a metal compound gas onto the surface of the substrate be performed while keeping the substrate under conditions wherein the substrate is placed in a reaction zone containing an oxide-forming substance and is heated to a temperature higher than the temperature of the metal compound gas. It is preferred that the reaction zone contains air at atmospheric pressure. It is also preferred that the metal compound gas is applied together with a carrier gas which is comprised of an inert gas, such as nitrogen gas. It is required that the contacting of the surface of the substrate with the metal compound gas be performed for a period of time sufficient to grow a plurality of metal oxide needles on the surface of the substrate and form the functional element of the present invention, wherein the functional element comprises a substrate having on an upper surface thereof a plurality of metal oxide needles extending upwardly of the upper surface of the substrate, with their respective central axes arranged substantially in parallel with each other, and must satisfy the features wherein the metal oxide needles have a weighted average circle-based diameter of from 0.01 to 10,000 $\mu$m and a weighted average aspect ratio of 0.1 or more and wherein the metal oxide needles are present at a density of from 0.01 to 10,000 needles per unit area having a size of 10 $\mu$m×10 $\mu$m at the upper surface of the substrate.

When the production of the functional element of the present invention by the above-mentioned method is conducted on a commercial scale, from the viewpoint of economy and technical ease, it is preferred that the reaction zone in which the substrate is placed contains air, and the metal compound gas reacts with an oxide-forming substance (such as oxygen, water or ammonia) contained in the air in the reaction zone to grow the metal oxide needles on the surface of the substrate. Further, from the viewpoint of reducing the equipment cost for the production, it is more preferred that the reaction zone is under atmospheric pressure. The present inventors have designated the above-mentioned production method using air at atmospheric pressure as an atmospheric CVD methods. It is known that a CVD (chemical vapor deposition) method is generally employed for forming metal oxide crystals on a surface of a substrate. However, the conventional CVD method is generally conducted under vacuum. In the CVD method performed under vacuum, when a metal compound gas is applied onto a surface of a substrate, the concentration of the metal compound gas present on the surface of the substrate is extremely low due to the vacuum conditions. Therefore, in the CVD method performed under vacuum, if it is intended, for example, to grow metal oxide structures on the surface of the substrate, a very long period of time is needed for growing crystals or noncrystals of a metal oxide on the surface of the substrate until metal oxide needles are formed thereon. Further, there has been no attempt to grow metal oxide needles on a surface of a substrate by the CVD method under vacuum. The present inventors have found for the first time that, by the atmospheric CVD method developed by the present inventors, a metal compound gas can be applied in a high concentration onto a surface of a substrate due to the atmospheric pressure conditions, so that a metal oxide grows at a high rate on the surface of the substrate, thereby obtaining metal oxide needles on the surface of the substrate in a short time. Further, the present inventors have made studies on, preferred conditions under which the metal oxide needles can be formed at a high density on an upper surface of the substrate, wherein the metal oxide needles extend upwardly of the upper surface of the substrate, with their respective central axes arranged substantially in parallel with each other. As a result, it has been found that the functional element of the present invention can be easily obtained by appropriately controlling various conditions, such as the temperature of the metal compound gas, the concentration of the metal compound gas applied onto the surface of the substrate, the application rate of the metal compound gas, and the temperature of the substrate.

As described above, Unexamined Japanese Patent Application Laid-Open Specification No. 50-6597 discloses a method for producing zinc oxide whiskers, in which a zinc alloy (comprising zinc and a metal having a boiling point higher than that of zinc) or a mixture of these two metals is heated under an oxygen-containing atmosphere in the presence of a substrate, to thereby form whiskers comprised of zinc oxide needles on the surface of the substrate. Although this prior art document does not have a clear description of the production method used therein, in this prior art technique, a metal oxide is formed on a substrate (specifically, on the inner wall surface of the apparatus used for the production) under atmospheric pressure. However, in this prior art technique, the obtained whiskers are cut off from the substrate (i.e., the inner wall surface of the apparatus) and provided for use as a reinforcement for a resin or a ceramic. In this prior art document, there is totally no suggestion that a structure comprising a substrate and metal oxide needles formed thereon is used as a functional element for an electric, an electronic or an optical device.

As mentioned above, the metal compound used as a raw material for forming metal oxide needles in the production of the functional element of the present invention has volatilizability or sublimability and has the capability to react with the above-mentioned oxide-forming substance (such as oxygen or water contained in the atmosphere) to form a metal oxide corresponding to the metal compound. In the present invention, the above-mentioned term metal compounds is intended to cover a metallic simple substance. Further, in the present invention, at least a part of the oxide-forming substance contained in the reaction zone in which the substrate is placed may be comprised of a substance (such as ozone) which is usually not present in the atmosphere.

Examples of metal compounds include: alkoxides, which are obtained by substituting the hydrogen atom of the hydroxyl group of an alcohol with an atom of a metal or a metal-like element; complexes, comprising an atom of a metal or a metal-like element and at least one ligand selected from the group consisting of acetylacetone, ethylenediamine, bipiperidine, bipyrazine, cyclohexanediamine, tetraazacyclotetradecane, ethylenediaminetetraacetic acid, ethylenebis(guanido), ethylenebis(salicylamine), tetraethyleneglycol, aminoethanol, glycine, triglycine, naphthyridine, phenanthroline, pentanediamine, pyridine, salicylaldehyde, salicylideneamine, porphyrin, thiourea; metal carbonyl compounds comprising a metal (such as Fe, Cr, Mn, Co, Ni, Mo, V, W or Ru) and a carbonyl group as a ligand; metal compounds having at least one ligand selected from the group consisting of a carbonyl group, an alkyl group, an alkenyl group, a phenyl group, an alkylphehyl group, an olefin group, an aryl group, a conjugated diene group (such as a cyclobutadiene group), a dienyl group (such as a cyclopentadienyl group), a triene group, an arene group and a trienyl group (such as a cycloheptatrienyl group); and metal halide compounds. Of these compounds, metal acetylacetonate compounds and metal alkoxides are preferred.

Further examples of complexes used as the metal compound in the method of the present invention include metal compounds comprising a metal and at least one ligand selected from the group consisting of β-diketones, keto esters, hydroxycarboxylic acids and salts thereof, various types of Schiff bases, keto alcohols, polyamines, alkanolamines, compounds having an enol-type active hydrogen, dicarboxylic acids, glycols and ferrocenes.

Specific examples of compounds as ligands in complexes used as the metal compound in the method of the present invention include acetylacetone, ethylenediamine, triethylenediamine, ethylenetetramine, bipiperidine, cyclohexanediamine, tetraazacyclotetradecane, ethylenediaminetetraacetic acid, ethylenebis(guanido), ethylenebis(salicylamine), tetraethyleneglycol, diethanolamine, triethanolamine, tartaric acid, glycine, triglycine, naphthyridine, phenanthroline, pentanediamine, salicylaldehyde, catechol, porphyrin, thiourea, 8-hydroxyquinoline, 8-hydroxyquinaldine, β-aminoethylmercaptan, bisacetylacetoneethylenediimine, Eriochrome Black T, oxine, salicylaldehyde oxime quinaldinate, picolinic acid, dimethylglyoximato, dimethylglyoxime, α-benzoin oxime, N,N'-bis(1-methyl-3-oxobutylidene)ethylenediamine, 3-((2-aminoethyl)amino)-1-propanol, 3-(aminoethylimino)-2-butane oxime, alanine, N,N'-bis-(2-aminobenzylidene)ethylenediamine, α-amino-α-methylmalonic acid, 2-((3-aminopropyl)amino)ethanol, aspartic, acid, 1-phenyl-1,3,5-hexanetrione, 5,5'-(1,2-ethanediyldinitrilo)bis(1-phenyl-1,3-hexanedione), 1,3-bis{bis(2-(1-ethylbenzimidazolyl)methyl)amino}-2-propanol, 1,2-bis(pyridinea-α-aldimino)ethane, 1,3-bis(bis(2-pyridylethyl)aminomethyl)benzene, 1,3-bis-(bis(2-pyridylethyl)aminomethyl)phenol, 2,2'-bipiperidine, 2,6-bis(bis(2-pyridylmethyl)aminomethyl)-4-methylphenol, 2,2'-bipyridine, 2,2'-bipyrazine, hydro-tris(1-pyrazolyl)borate ion, catechol, 1,2-cyclohexanediamine, 1,4,8,11-tetraazacyclododecane, 3,4:9,10-dibenzo-1,5,8,12-tetraazacyclotetradecane-1,11-diene, 2,6-diacetylpyridine dioxime, dibenzylsulfide, N-(2-(diethylamino)ethyl)-3-amino-1-propanol, o-phenylene bis(dimethylphosphine), 2-(2-(dimethylamino)ethylthio)ethanol, 4,4'-dimethyl-2,2'-bipyridine, N,N'-dimethyl-1,2-cyclohexanediamine, dimethylglyoxime, 1,2-bis(dimethylphosphino)ethane, 1,3-bis(diacetylmonooximeimino)propane, 3,3'-trimethylenedinitrobis(2-butane oxime)1,5-diamino-3-pentanoldipivaroylmethane, 1,2-bis(diphenylphosphino)ethane, diethyldithiocarbamate ion, N,N'-bis(2-(N,N'-diethylaminoethyl)aminoethyl)-oxamide, ethylenediaminetetraacetic acid, 7-hydroxy-4-methyl-5-azaheptane-4-ene-2-one, 2-aminoethanol, N,N'-ethylenebis(3-carboxysalicylideneamine), 1,3-bis(3-formyl-5-methylsalicylideneamine)propane, 3-glycylamino-1-propanol, glycylglycine, N'-(2-hydroxyethyl)ethylenediaminetriacetic acid, hexafluoroacetylacetone, histidine, 5,26:13,18-diimino-7,11:20,24-dinitrodibenzo(c,n)-1,6,12,17-tetraazacyclodocosyne, 2,6-bis(N-(2-hydroxyphenyl)iminomethyl)-4-methylphenol, 5,7,12,12,14-hexamethyl-1,4,8,11-tetraazacyclotetradecane-N,N''-diacetic acid, 1,2-dimethylimidazole, 3,3'-ethylenebis(iminomethylidene)-di-2,4-pentanedione, N,N'-bis(5-amino-3-hydroxypentyl)malonamide, methionine, 2-hydroxy-6-methylpyridine, methyliminodiacetic acid, 1,1-dicyanoethylene-2,2-dithiol, 1,8-naphthyridine, 3-(2-hydroxyethylimino)-2-butanone oxime, 2,3,7,8,12,13,17,18-octaethylporphyrin, 2,3,7,8,12,13,17,18-octamethylporphyrin, oxalic acid oxamide, 2-pyridylaldoxime, 3-(2-(2-pyridyl)ethylamino)-1-propanol, 3-(2-pyridylethylimino)-2-butanone oxime, 2-picolylamine, 3-(2-pyridylmethylimino)-2-butanone oxime, dihydrogen diphosphite ion, 3-n-propylimino-2-butanone oxime, proline, 2,4-pentanediamine, pyridine, N,N'-dipyridoxylideneethylenediamine, N-pyridoxylideneglycine, pyridine-2-thiol, 1,5-bis(salicylideneamino)-3-pentanol, salicylaldehyde, N-salicylidenemethylamine, salicylic acid, N-(salicylidene)-N-'(1-methyl-3-oxobutylidene)ethylenediamine, salicylideneamine, N,N'-disalicylidene-2,2'-biphenediamine, N,N'-disalicylidene-2-methyl-2-(2-benzylthioethyl)ethylenediamine, N,N'-disalicylidene-4-aza-1,7-heptanediamine, N,N'-disalicylideneethylenediamine, N-salicylideneglycine, salicylaldoxime, N,N'-disalicylidene-o-phenylenediamine, N,N'-disalicylidenetrimethylenediamine, 3-salicylideneamino-1-propanol, tetrabenzo(b,f,j,n)-1,5,9,13-tetraazacyclohexadecyne, 1,4,7-triazacyclononane, 5,14-dihydrodibenzo(b,i)-1,4,8,11-tetraazacyclotetradecyne, tris(2-benzimidazolylmethyl)amine, 6,7,8,9,16,17,18,19-octahydrodicyclohepta(b,j)-1,4,8,11-tetraazacyclotetradecene, 4,6,6-trimethyl-3,7-diazanone-3-ene-1,9-diol, tris(3,5-dimethyl-1-pyrazolylmethyl)amine, 2,2':6',2''-terpyridine, 5,7,7,12,14,14-hexamethyl-1,4,8,11-tetraazacyclotetradecane, tetrahydrofuran, tris(2-pyridylmethyl)amine, N,N,N',N'-tetramethylurea, N,N'-bis(3-aminopropyl)oxamide, N,N,N',N'-tetrakis(2-pyridylmethyl)ethylenediamine, all-cis-5,10,15,20-tetrakis(2-(2,2'-dimethylpropionamido)phenyl)porphyrin, 5,10,15,20-tetraphenylporphyrin, 1,4,7-tris(2-pyridylmethyl)-1,4,7-triazacyclononane, hydrotris(1-pyrazolyl)borate, 3,3',4-trimethyldipyrromethene, trimethylenediaminetetraacetic acid, 3,3',5,5'-tetramethyldipyrromethene, and 5,10,15,20-tetrakis(p-tolylporphyrin).

As mentioned above, in the functional element of the present invention, it is required that the metal oxide needles extend upwardly of the upper surface of the substrate, with their respective central axes arranged substantially in parallel with each other. The parallelism of the respective central axes of the metal oxide needles can be measured by the X-ray locking curve method. It is preferred that the leaning angles of the metal oxide needles are each 10 degrees or less, more advantageously each 5 degrees or less, wherein the leaning angles of the metal oxide needles are defined as angles at which the central axes lean away from a straight line extending in a direction vertical to the surface of the substrate. In many cases, the leaning angles of the metal oxide needles vary depending on the type of the substrate used in the functional element of the present invention. It is preferred to use as the substrate a material selected from metals (including silicon), metal oxides and semiconductor single crystals (such as ZnTe, GaP, GaAs and InP), since, when such a material is used as the substrate, the leaning angles of the metal oxide needles become small. With respect to the type of the single crystal used as a material for the substrate, it is preferred to use a single crystal having lattice constants close to the lattice constants of a metal oxide crystal obtained when the metal oxide needles formed are crystalline. More particularly, the ratios of the lattice constants of the metal oxide crystal at the surface thereof contacting the substrate to the corresponding lattice constants of the single crystal substrate at the surface thereof contacting the metal oxide crystal are each preferably from 0.8 to 1.2, more preferably from 0.9 to 1.1, most preferably from 0.95 to 1.05. The lattice constants of a crystal can be measured by a conventional method, such as the wide angle X-ray diffraction method. Especially preferred single crystals used as a material for the substrate are single crystals of silicon and single crystals of metal oxides, such as aluminum oxide, magnesium oxide and $SrTiO_3$. When the material for the substrate is crystalline, the crystalline form of the material may be any form selected from the group consisting of a single crystal, a combination of two or more single crystals, a polycrystal, a semicrystal having both a non-crystalline portion and a crystalline portion, and a mixture thereof. Of these crystals, a single crystal is most preferred. When the material for the substrate is of a single crystal, it is preferred that the upper surface of the substrate is comprised of one of the crystal faces of the single crystal. For example, when it is intended to form titanium oxide needles on a surface of a substrate comprised of a magnesium oxide single crystal, it is preferred that the upper surface of the substrate is the (100) face of the magnesium oxide single crystal. When it is intended to form zinc oxide needles on a surface of a substrate comprised of a silicon single crystal, it is preferred that the upper surface of the substrate is the (111) face of the silicon single crystal. When it is intended to form zinc oxide needles on a surface of a substrate comprised of an aluminum oxide single crystal, it is preferred that the upper surface of the substrate is the (0001) face of the aluminum oxide single crystal. When it is intended to form zinc oxide needles on a surface of a substrate comprised of an $SrTiO_3$ single crystal, it is preferred that the upper surface of the substrate is the (001) face of the $SrTiO_3$ single crystal. When such a single crystal form of the material is used for the substrate, each of the leaning angles of the crystal axes can generally be controlled to an angle of 5 degrees or less.

When a ceramic, a metal (such as silicon, Fe or Ni) or a non-single-crystal material (such as glass or a plastic) is selected as a material for the substrate, the leaning angles of the metal oxide needles tend to be large. In the present invention, when such a material is used for the substrate, it is preferred that the leaning angles of the metal oxide needles are each 20 degrees or less, more advantageously each 15 degrees or less, most advantageously each 10 degrees or less. In the case where such a material is used for the substrate, the leaning angles of the metal oxide needles can be reduced by subjecting the surface of the substrate to orientation treatment.

When the functional element of the present invention is, for example, an electron emission element for use in an electric or an electronic device, or a laser emission element for use in an optical device, in some cases it is preferred that the metal oxide needles present on the surface of the substrate are arranged at regular intervals. The arrangement of the metal oxide needles at regular intervals on the surface of the substrate can be realized by, for example, a method in which convex portions are formed at regular intervals on the surface of the substrate by etching by a conventional microfabrication technique using carbon dioxide gas lasers, YAG lasers, electron ray or X-ray lithography or the like. The reason for this is as follows. As described above, in producing the functional element of the present invention by the "atmospheric CVD method", a metal compound gas is applied onto the surface of the substrate to thereby grow metal oxide needles on the surface of the substrate. When the surface of the substrate has convex portions, the metal oxide needles grow faster at the convex portions of the surface of the substrate than at the concave portions of the surface of the substrate. Therefore, when the surface of the substrate has convex portions which are arranged at regular intervals, there can be obtained metal oxide needles which are arranged at regular intervals in accordance with the regular-interval arrangement of the convex portions on the surface of the substrate. When the functional element of the present invention is an electron emission element, a laser emission element or the like, it is preferred that the functional element has the thus obtained metal oxide needles arranged at regular intervals. In this case, it is more preferred that the metal oxide needles are arranged so that the spacing differences among pairs of adjacent metal oxide needles are within the range of ±1 μm or less, more advantageously ±0.5 μm or less, still more advantageously ±0.25 μm or less.

Hereinbelow, a more illustrative explanation is made with respect to the preferred method for producing the functional element of the present invention.

FIG. 1 is a diagram showing a preferred example of production systems usable for producing the functional element of the present invention.

Referring to FIG. 1, nitrogen gas, which flows at a flow rate of 1.2 $dm^3$/min in the direction indicated with an arrow, is first supplied to a water-trapping apparatus in which the nitrogen gas is subjected to cooling-dehydration using liquid nitrogen or the like. The resultant dedydrated nitrogen gas is led into a metal compound-heating vessel which has an internal temperature set at 115° C. In the metal compound-heating vessel, a metal compound $Zn(C_5H_7O_2)_2$ is heated by means of a heater to gasify the metal compound, thereby obtaining a metal compound gas, and the obtained metal compound gas, entrained by the nitrogen gas, flows out from the metal compound-heating vessel and is applied onto a surface of a substrate through a blow-off slit of a nozzle. The gas flow line running downstream of the metal compound-heating vessel is heated by means of a ribbon heater (not shown). The substrate is comprised of an $Al_2O_3$ single crystal plate having the (0001) face thereof facing the blow-off slit above, and the substrate is heated to 550° C. by means of a heater. By the application of the gasified $Zn(C_5H_7O_2)_2$ onto the surface of the substrate, metal oxide needles are grown on the surface of the substrate.

In producing the functional element of the present invention by using a system as shown in FIG. 1, for obtaining the specific metal oxide needles defined in the present invention, it is important to appropriately control the heating temperatures of the metal compound and the substrate. The desired heating temperature for gasifying the metal compound gas varies depending on the type of the metal compound. However, it is preferred that the metal compound is heated to a temperature which is the same as or higher than the volatilizing point or the sublimating point of the metal compound, more advantageously a temperature of from 30 to 600° C., still more advantageously a temperature of from 50 to 300° C.

The thus obtained metal compound gas as such may be applied onto the surface of the substrate to thereby form metal oxide needles on the surface of the substrate. Alternatively, the metal compound gas may be applied together with another gas as a medium (a carrier gas) onto the surface of the substrate to form metal oxide needles on the surface of the substrate. Of these two methods, the latter using a carrier gas is preferred. When a carrier gas is used, the preferred flow rate of the carrier gas varies depending on the temperature at which the metal compound is gasified and the atmosphere of the reaction zone in which the metal oxide needles are formed. When the temperature and pressure of the reaction zone are room temperature and atmospheric pressure, respectively, it is preferred that the carrier gas is flowed at a space velocity of 20/min or less, more advantageously 5/min or less, wherein the space velocity of the carrier gas is defined as the value obtained by dividing the flow rate of the carrier gas per minute by the internal volume of the metal compound-heating vessel.

In the method of the present invention, the growth rate of the metal oxide needles varies depending on the concentration of the metal compound gas on the surface of the substrate. Therefore, for easily obtaining the metal oxide needles defined in the present invention, it is important to appropriately control the concentration of the metal compound gas on the surface of the substrate. The concentration of the metal compound gas on the surface of the substrate varies depending basically on the supersaturation degree of the metal compound gas on the surface of the substrate, wherein the supersaturation degree is defined by the formula: supersaturation degree={(((actual vapor pressure)−(equilibrium vapor pressure))/equilibrium vapor pressure}× 100. For producing the metal oxide needles defined in the present invention, it is preferred that the supersaturation degree of the metal compound gas on the surface of the substrate is 1% or more, more advantageously 10% or more, most advantageously 20% or more.

With respect to the carrier gas which may be preferably used in the application of the metal compound gas onto the surface of the substrate, there is no particular limitation as long as the carrier gas does not react with the metal compound. Specific examples of carrier gases include inert gases (such as nitrogen gas, helium, neon and argon), carbon dioxide gas and organic substances (such as organofluorine compound gas, heptane and hexane). Of these gases, inert gases are more preferred from the viewpoint of safety and economy. Nitrogen gas is most preferred from the viewpoint of economy.

When the metal compound gas is applied onto the surface on the substrate to form metal oxide needles on the surface of the substrate, the desired distance between the blow-off opening of the nozzle for blowing the metal compound gas and the surface of the substrate varies depending on the size of the metal-oxide needles to be formed on the surface of the substrate and also depending on the morphology of the blow-off opening of the nozzle. However, in general, with respect to the ratio of the distance between the blow-off opening of the nozzle and the surface of the substrate to the length of the major axis of the blow-off opening of the nozzle, the ratio is preferably from 0.01 to 1, more preferably from 0.05 to 0.7, most preferably from 0.1 to 0.5. In general, when the above-mentioned ratio is more than 1 (unity), the conversion efficiency of the metal compound gas into the metal oxide needles tends to be lowered.

With respect to the temperature of the substrate during the application of the metal compound gas onto the surface of the substrate to form the metal oxide needles thereon, there is no particular limitation as long as the temperature of the substrate is at a level which is higher than that of the metal compound gas and at which the metal oxide can be formed near and on the surface of the substrate. However, in some cases, the temperature of the substrate which is being contacted with the metal compound gas influences the morphology of the metal oxide needles formed. Therefore, the temperature of the substrate is preferably from 0 to 800° C., more preferably from 20 to 800° C., most preferably from 100 to 700° C.

In the production of the functional element of the present invention, when oxygen, water or the like capable of reacting with the metal compound is present in a region of the production system, which region extends from the site where the metal compound is volatilized or sublimated to form the metal compound gas to the site of the blow-off opening of the nozzle for blowing the obtained metal compound gas into the reaction zone, a metal oxide is inadvertently formed in the system before the blow-off of the metal compound gas into the reaction zone, so that a clogging or the like is likely to occur in the system, and the metal oxide needles having a desired morphology cannot be obtained. However, when the metal compound used has a property such that it reacts with oxygen, water or the like at only an extremely small reaction rate, the oxygen, water or the like may be present in the above-mentioned region of the production system, which region is upstream of the blow-off opening of the nozzle for blowing the metal compound gas into the reaction zone.

With respect to the atmosphere of the reaction zone wherein the surface of the substrate is contacted with the metal compound gas, the atmosphere may be under reduced pressure, under atmospheric pressure or under elevated pressure. However, when the contacting of the surface of the substrate with the metal compound gas is performed in a reaction zone which is under highly reduced pressure (such as ultrahigh vacuum), a long period of time (for example, a period of several days) is needed for growing metal oxide needles on the surface of the substrate. Such a low growth rate of the metal oxide needles lowers the productivity and, hence, is commercially impractical. When the contacting of the surface of the substrate with the metal compound gas is performed in a reaction zone which is under elevated pressure, no problem arises with respect to the growth rate of the metal oxide needles, but an apparatus for pressurizing is needed. In general, it is preferred that the contacting of the surface of the substrate with the metal compound gas is conducted under 0.001 to 20 atm, more advantageously under 0.1 to 10 atm, most advantageously under atmospheric pressure.

There is no particular limitation with respect to the reaction time (i.e., the time of the contacting of the surface of the substrate with the metal compound gas) for forming the metal oxide needles on the surface of the substrate. However, it is necessary that the reaction time is satisfactory for obtaining the metal oxide needles having the specific aspect ratio required in the present invention. The desired reaction time varies depending on the contacting conditions and the type of the raw material (metal compound) used. For example, when the contacting of the surface of the substrate with the metal compound gas is conducted under conditions wherein zinc acetylacetonate is used as the metal compound and the reaction zone is under atmospheric pressure, metal oxide needles begin to appear about 5 minutes after the start of the contacting (i.e., the start of the application of the metal compound gas onto the surface of the substrate), and the length of the metal oxide needles reaches 100 $\mu$m about 300 minutes after the start of the contacting. However, when zinc acetylacetonate is used as the metal compound, the reaction time is preferably more than 10 minutes, more preferably 15 minutes or more. The reason for this is because the longer the reaction time, the larger the aspect ratio (the ratio of the length to the circle-based diameter of cross-section) of the metal oxide needles becomes and the larger the surface area of the metal oxide needles becomes. When tetraisopropoxytitanate is used as the metal compound, metal oxide needles having a length of 4 $\mu$m are obtained about 3 minutes after the start of the contacting, wherein each of the metal oxide needles is substantially of a rod morphology.

When metal oxide needles containing two or more types of metals are desired, such metal oxide needles can be obtained by using a mixed gas of oxides of two or more types of metals. Such a mixed gas can be obtained either by gasifying a mixture of two or more metal compounds or by mixing two or more gasified metal compounds. These methods can be used in combination.

In the functional element of the present invention, the metal oxide needles are present at a high density at the surface of the substrate, and spaces are left between the metal oxide needles. When the functional element of the present invention, which contains the metal oxide needles having a specific structure, is used in an electric, an electronic or an optical device, it is possible that the functional element suffers a deformation, depending on the conditions under which the functional element is used. Specifically, it is possible that the metal oxide needles sustain a physical stress, so that a large number of the metal oxide needles are brought down. Such a deformation of the metal oxide needles can be prevented by securing the metal oxide needles to each other by means of at least one substance. Examples of substances used for the securing include organic substances, such as a thermo plastic resin, a thermosetting resin, an elastomer and an instant adhesive (such as cyanoacrylate), inorganic substances (such as glasses and ceramics), and metals.

Examples of thermoplastic resins used for securing the metal oxide needles to each other include a low, middle or high density polyethylene, polypropylene, polymethylpentene, poly(vinyl chloride), polystyrene, an acrylonitrile/styrene copolymer (hereinafter referred to simply as "SAN resin"), an acrylonitrile/butadiene/styrene copolymer (hereinafter referred to simply as "ABS resin"), polyamide, polyacetal, polycarbonate, polyethylene terephthalate, polybutylene terephthalate, polyphenylene ether, polymethyl methacrylate, polyetherimide, polysulfone, polyarylate, polyphenylenesulfite, a styrene-butadiene copolymer and a hydrogenation product thereof. Further examples of thermoplastic resins used for securing the metal oxide needles to each other include a polymer blend comprising two or more polymers selected from those polymers mentioned above and a copolymer. Examples of polymer blends include a polymer blend of polycarbonate and an acrylonitrile-butadiene-styrene copolymer, and a polymer blend of polyphenylene ether and polystyrene.

Examples of thermosetting resins used for securing the metal oxide needles to each other include an epoxy resin, a xylene resin, a guanamine resin, a diallylphthalate resin, a vinyl ester resin, a phenol resin, an unsaturated polyester resin, a furan resin, polyimide, poly(p-hydroxybenzoic acid), polyurethane, a maleic acid resin, a melamine resin and a urea resin.

Examples of elastomers used for securing the metal oxide needles to each other include natural rubber and synthetic rubbers, such as a butadiene rubber, a silicone rubber, a polyisoprene rubber, a chloroprene rubber, an ethylenepropylene rubber, a butyl rubber, an isobutylene rubber, a styrene/butadiene rubber, a styrene/isoprene/styrene block copolymer rubber, an acrylic rubber, an acrylonitrile/butadiene rubber, a rubber hydrochloride, a chlorosulfonated polyethylene rubber and a polysulfide rubber. Further examples of elastomers used for securing the metal oxide needles to each other include polytetrafluoroethylene, a petroleum resin and an alkyd resin. Further, cyanoacrylates, which are generally used as instant adhesives can be also used.

The functional element of the present invention, which contains the metal oxide needles having a specific structure, can be obtained by the above-described method. The functional element is advantageous in that the metal oxide needles have an extremely large surface area. Further, by appropriately selecting the metal species of the metal oxide needles, the metal oxide needles are each able to have a pointed tip or have the morphology of a prism. By virtue of these advantages and various functional properties of the metal oxide needles, the functional element of the present invention can be used as a component for an electric, an electronic or an optical device.

Hereinbelow, electric, electronic and optical devices in which the functional element of the present invention can be used are described with reference to illustrative examples.

Examples of electric and electronic devices include devices making use of various functional properties of metal oxides, such as electron emission properties, magnetic properties, electromagnetic wave shielding properties, piezoelectric properties, ferroelectric properties, electroconductive properties, resistance or insulating properties and thermal conversion properties. Examples of optical devices include devices making use of various functional properties of metal oxides, such as transparency properties, light transmission, absorption or reflection properties, thermal transmission, absorption or reflection properties, light emission properties optical waveguide properties and photocatalyst properties.

Specific examples of uses of the functional element of the present invention are described below with reference to illustrative examples of devices using the functional element.

(1) Electron Emission Element Making Use of Electron Emission Properties:

When zinc oxide is used for forming the metal oxide needles of the functional element of the present invention, the metal oxide needles have pointed tips. It is a well-known phenomenon that a lightning conductor rod, which has a pointed tip, can be easily hit by a stroke of lightning. Further, the present inventors have found that, when a voltage is applied to a functional element in which the metal oxide needles have pointed tips, wherein the metal oxide needles are covered with an electroconductive substance or have electroconductivity, the metal oxide needles easily emit electrons from their pointed tips. Specifically, the present inventors have confirmed that, when the same voltage is applied to a functional element containing the metal oxide needles having pointed tips and to a functional element containing a metal oxide structure which is not of a needle shape but of a flat shape, the former exhibits electron emission ability at least ten times as high as that of the latter. When the functional element of the present invention contains ZnO needles having pointed tips, the functional element can be imparted with electron emission ability, for example, by coating a part or the whole of the ZnO needles with an electroconductive substance or by rendering the ZnO needles themselves electroconductive (for example, by doping the ZnO needles with Al). In this case, it is preferred that the above-mentioned electroconductive substance has an electric resistivity of 10 $\Omega \cdot m$ or less, more advantageously 110 $\Omega \cdot m$ or less. Examples of electroconductive substances include a metal, a metal paste, a combination of a metal and a metal paste, an electroconductive metal oxide, such as ITO ($In_2O_3/SnO_2$), and an electroconductive resin. With respect to the type of the metal as an electroconductive substance, there is no particular limitation. Specific examples of metals include copper, nickel, chromium, iron, gold, silver, palladium, aluminum, zinc, tin, silicon, titanium, and an alloy thereof.

Further, the electron emission ability of the above-mentioned electron emission element can be improved by a method in which, after coating the metal oxide needles with an electroconductive substance or rendering the metal oxide needles themselves electroconductive, the upper end portion of each of the metal oxide needles is coated with one or more types of highly conductive substances.

Examples of highly conductive substances include elements belonging to Groups 1 to 15 of the Periodic Table, exclusive of hydrogen (belonging to Group 1), boron (belonging to Group 13), nitrogen (belonging to Group 15), phosphorus (belonging to Group 15) and arsenic (belonging to Group 15); oxides of metals selected from the above-mentioned elements: and carbonaceous materials. Of these substances, carbonaceous materials are preferred. Specific examples of carbonaceous materials include graphite, diamond, diamond-like carbon (DLC) and carbon nitride. Of these substances, diamond and diamond-like carbon are especially preferred, since diamond and diamond-like carbon have a high electron emission ability. Examples of methods for coating the above-mentioned electroconductive or highly electroconductive substances onto the metal oxide needles include vapor deposition, sputtering, dipping, CVD and PVD (physical vapor deposition).

Examples of electric and electronic devices in which the functional element of the present invention is used as an electron emission element include electron emission devices, such as a cold-cathode tube for a liquid crystal display, a field emission display and a plasma display; and an electron gun for a television set. Further, since the functional element of the present invention can emit electrons from a large area of the upper surface thereof, the functional element of the present invention can be used as a flat fluorescent lamp. A flat fluorescent lamp emitts light from a flat surface, differing from an ordinary fluorescent lamp having a tubular shape. A flat fluorescent lamp can be advantageously used as a backlighting device for use in a backlighting type liquid crystal display. In a conventional backlighting type liquid crystal display, the backlighting device is comprised of a complicated structure wherein a cold-cathode tube (i.e., fluorescent tube)(positioned in a side portion of the display) is optically connected to a light guiding/distributing plate positioned in the back portion of the display. By contrast, when a flat fluorescent lamp is disposed in the back portion of the display, the flat fluorescent lamp as such can function as a backlighting device without using an additional component.

As described above, the functional element of the present invention used as an electron emission element can emit electrons more easily than an electron emission element containing a conventional metal oxide structure having a flat morphology, when the emission is effected under conditions wherein the same voltage is applied to these two functional elements. Therefore, when the functional element of the present invention is used as an electron emission element in an electric or an electronic device, the emission of light having a given luminance can be obtained under a lower voltage than in the case of an electric or an electronic device containing a conventional electron emission element. Accordingly, by using the functional element of the present invention, an electric or an electronic device of an energy saving type can be produced which can emit higher luminance light under a given voltage than a conventional electric or an electronic device.

(2) Capacitor Element Making Use of Ferroelectric Properties:

The metal oxide needles in the functional element of the present invention have a large surface area. Conventional capacitors generally used are lamination type ceramic capacitors. A ceramic capacitor contains a metal oxide having ferroelectric properties (such as barium titanate). As described above, the performance of a capacitor depends on its capacitance. The capacitance of a ceramic capacitor is proportional to the surface area of the metal oxide used therein, and inversely proportional to the thickness of the metal oxide. In a conventional lamination type ceramic capacitor, a high capacity is obtained by laminating a large number of layers (as large as approximately 100 layers) comprising electrode layers and thin layers of a ferroelectric substance (i.e., metal oxide thin layers). However, from the commercial viewpoint, it is difficult to produce a laminate material comprising a large number of electrode layers and ferroelectric substance thin layers. The functional element of the present invention, such as a functional element containing a ferroelectric oxide (such as barium titanate) in the form of metal oxide needles, can be used as a capacitor element having a high capacitance. A capacitor element having a high capacitance can also be obtained by a method in which metal oxide needles comprised of an insulating oxide (such as zinc oxide) are formed on a surface of a substrate, a thin film of an electroconductive substance is formed on the metal oxide needles, and a thin film of a ferroelectric oxide (such as barium titanate) is formed on the thin film of the electroconductive substance, thereby obtaining a laminate of an electroconductive substance layer and a ferroelectric oxide layer, which laminate is coated on the metal oxide needles. In the case of a conventional lamination type ceramic capacitor containing layers of a ferroelectric substance (such as barium titanate), it is now technically impossible to reduce the thickness of each layer of the ferroelectric substance to 6 $\mu$m or less. By contrast, according to the present invention, a metal oxide structure (comprised of needles) having a thickness of less than 6 $\mu$m can be obtained by the atmospheric CVD method. Further, the metal oxide needles in the functional element of the present invention have a large surface area. When these factors are taken into consideration, it is considered that, theoretically, the capacitance of a capacitor using the functional element of the present invention (containing the metal oxide needles and, coated thereon, a laminate of an electroconductive substance layer and a ferroelectric oxide layer) is 30 times as high as that of a conventional lamination type ceramic capacitor. The capacitance of the capacitor using the functional element of the present invention can be further enhanced simply by a method in which, on the above-mentioned laminate of an electroconductive substance layer and a ferroelectric oxide layer, another laminate of the same construction comprising an electroconductive substance layer and a ferroelectric oxide layer) is additionally formed. The capacitance of the capacitor using the functional element of, the present invention can be still further enhanced simply by employing three or more laminates of the same construction. As examples of ferroelectric metal oxides usable in a capacitor comprising the functional element of the present invention, there can be mentioned barium titanate and strontium titanate. These two ferroelectric metal oxides can be suitably used in the "atmospheric CVD method" for producing the functional element of the present invention containing the metal oxide needles. (However, the method for producing the functional element is not limited to the "atmospheric CVD method".) Examples of electroconductive substances include metals and electroconductive metal oxides, such as ITO ($In_2O_3/SnO_2$). With respect to the type of the metal as an electroconductive substance, there is no particular limitation. Specific examples of metals include copper, nickel, chromium, iron, gold, silver, palladium, aluminum, zinc, tin, silicon, titanium, and an alloy thereof. Examples of methods for forming an electroconductive film include vapor deposition, sputtering, dipping, CVD and PVD.

An electric or an electronic device in which the functional element of the present invention is used as a capacitor element has a high capacitance, so that such a device can be advantageously used in electric or electronic equipment of small size, such as a portable telephone.

(3) Memory Element Making Use of Ferroelectric Properties:

The functional element of the present invention has ferroelectric properties. It has been being attempted to develop a ferroelectric memory element making use of the ferroelectric properties of the functional element. A ferroelectric memory has an advantage in that a ferroelectric memory has non-volatility, exhibits a short access time, has a long life and does not require a large electric power. Therefore, in recent years, studies have been being made to develop, for example, noncontact IC cards using a ferroelectric memory. PZT (i.e., a ternary metal oxide containing three elements Pb, Zr and Ti) is generally used as a ferroelectric substance. However, conventionally, such a metal oxide having ferroelectricity is used in the form of a flat structure formed on a surface of a substrate. Therefore, a conventional ferroelectric memory has poor memory function and the use of a conventional ferroelectric memory is limited.

By contrast, when the functional element of the present invention is used as a memory element, each of the metal oxide needles of the functional element is able to have memory function, so that the memory element can exhibit a high memory capacity. Specifically, a memory element having a high memory capacity can be obtained from the functional element of the present invention by, for example, the following method. First, the spaces between the metal oxide needles are filled with an insulating material. Then, to electrodes of transistors are connected the metal oxide needles embedded in the insulating material (wherein each of the electrodes is connected with one or several needles), thereby obtaining a memory element. Examples of metal oxides exhibiting ferroelectricity include the above-mentioned PZT, a ternary metal oxide containing three elements Ba, Na and Nb, and a binary metal oxide containing two elements Sr and Nb.

An electric or an electronic device using a memory element comprising the functional element of the present invention has a high memory capacity. Therefore, the functional element can be very advantageously applied to various devices, such as memory discs, such as a DVD (digital versatile disc), which has been widely used in recent years, and a memory element for a computer.

(4) Sensor Element Making Use of Resistance Properties:

The metal oxide needles in the functional element of the present invention have a large surface area. By virtue of this property, the functional element can be used as a sensor element. A sensor is a device which detects physical quantities by converting the physical quantities into resistance values. Examples of sensors include a temperature sensor, a gas sensor and a humidity sensor. In a temperature sensor, a metal oxide, such as nickel oxide, cobalt oxide or barium titanate, is used. In a gas sensor, tin oxide, iron oxide, zinc oxide or the like is used. In a humidity sensor, aluminum oxide, zinc oxide, zirconium oxide or the like is used. In general, a sensor containing a metal oxide is produced by a method in which a thin film of the metal oxide is formed on a substrate by vapor deposition or sputtering, or a method in which the metal oxide is mixed with a binder to thereby obtain a metal oxide paste and the paste is coated on a substrate. However, the thus produced conventional sensor is unsatisfactory and it has been desired to improve the sensitivity and the response speed of the conventional sensor. The metal oxide needles in the functional element of the present invention have a large surface area, so that the functional element can be used as a sensor exhibiting high sensitivity and high response speed. For example, a sensor comprising the functional element of the present invention can be obtained by connecting an electrode to each of the respective upper end portions of the metal oxide needles and also connecting an electrode to a surface of the substrate. With respect to the material of the electrode, there is no particular limitation as long as the material has an electroconductivity.

An electric or an electronic device using the sensor comprising the functional element exhibits a high sensitivity and a high response speed. Therefore, miniaturization of the device is possible, and, also, the device can be advantageously applied to a field in which it is required to detect a subtle change in the environment. Accordingly, the functional element of the present invention is very useful.

(5) Laser Emission Element Making Use of Light Emission Properties:

In recent years, a CD (compact disc) has been widely used as an information storage medium and a red laser emission element has been used for reading out information from a CD. When a laser having a smaller wavelength, such as an ultraviolet light laser, is used for reading out information from a CD, a reading-out of information which is recorded at a higher density becomes possible, so that more formation can be recorded on a CD. For this reason, studies for using GaN for a laser emission element has now been being conducted (the wavelength of a GaN laser is 410 nm, whereas the wavelength of a red laser is 650 nm). For the purpose of using GaN for a laser emission element, an optical device has been proposed which comprises a laser emission part, a mirror part for reflecting the laser and a current introduction electrode part, wherein these three parts are integrated with each other. However, the proposed device has problems in that the device has a complicated structure, and the three parts of the device have different compositions. Therefore, if the device is used for a long period of time, the arrangement of the atoms of the materials constituting the device is disturbed and adversely affected by the heat generated by the operation of the device, so that the performance of the device inevitably becomes lowered. By contrast, as explained below, the functional element of the present invention can be advantageously used as a laser emission element exhibiting high performance and high reliability. In the case of the functional element containing metal oxide needles comprised of ZnO, the functional element as a laser emission element can emit a laser having a wavelength (380 nm) smaller than that of the GaN laser, so that the functional element of the present invention enables a higher density recording and a higher speed signal transmission than the GaN laser. Further, an optical device in which the functional element of the present invention is used as a laser emission element has a simple structure, as compared to that of an optical device using GaN as a laser emission element. Furthermore, the optical device in which the functional element of the present invention is used as a laser emission element is free from the problem that a lowering of performance is caused by the heat generated by the operation of the device. The metal oxide usable for forming the metal oxide needles is not limited to ZnO, and a metal oxide other than ZnO can also be used for forming the metal oxide needles of the functional element of the present invention as a laser emission element emitting a small wavelength laser. Examples of such metal oxides include CoO, anatase a type $TiO_2$, rutile type $TiO_2$, MnO, $BaTiO_3$ and CdO. CoO, anatase type $TiO_2$, rutile type $TiO_2$, MnO, $BaTiO_3$ and CdO are able to emit lasers having wavelengths of 310 nm, 388 nm, 354 nm, 459 nm, 459 nm and 539 nm, respectively. When the functional element of the present invention as a laser emission element is used in an optical device, the functional element is used in combination with an excitation source. The excitation source excites atoms contained in the functional element by giving an energy, such as an electromagnetic wave, heat or electricity, to the substrate of the functional element. The excited atoms emit electromagnetic waves when the atoms return from an excited state to the ground state. Examples of excitation sources include a lamp and a current.

As described above, there is a report that nanocrystals of ZnO formed on the surface of a substrate are used as an ultraviolet laser emission element (see "Kotai Butsuri (Solid State Physics)", vol. 33, no. 1, pp. 59–64 (1998)). However, the nanocrystals of ZnO formed on the surface of a substrate each have a height of 5 nm and a circle-based diameter of 100 nm. That is, the aspect ratio of the conventional ZnO nanocrystals, i.e., the ratio of the length of the nanocrystals to the circle-based diameter of the cross-sections thereof (length/circle-based diameter of cross-section) is only 0.05, which is very small, as compared to the aspect ratio (0.1 or more) of the metal oxide needles in the functional element of the present invention. When the functional element of the present invention (containing the metal oxide needles having an aspect ratio of 0.1 or more) is used as a laser emission element, a high output of laser can be obtained, as compared to that obtained by the conventional ZnO nanocrystals. The reason for this is as follows. In the functional element of the present invention, laser emission occurs in a direction perpendicular to a straight line extending in the thicknesswise direction of the metal oxide structure comprised of the metal oxide needles (wherein the thicknesswise direction of the metal oxide structure comprised of the needles corresponds to the lengthwise direction of the metal oxide needles). Therefore, the larger the thickness of the metal oxide structure comprised of the needles, the higher the output of the laser emission element. In other words, the longer the metal oxide needles (i.e., the larger the aspect ratio of the metal oxide needles), the higher the output of the laser emission element.

Further, in the functional element of the present invention, a large number of metal oxide needles having the same size can be present on the surface of the substrate. By increasing the number of the metal oxide needles, the laser output capability of the functional element as a laser emission element can be increased.

When the functional element of the present invention is used as a laser emission element in an optical device, the optical device can emit a laser having a wavelength smaller than a laser emitted by a conventional optical device. Therefore, the functional element of the present invention can be very advantageously used for providing an optical device which enables accurate reading-out of high density information, and high speed transmission of information.

(6) Optical Switch Element Making Use of Optical Waveguide Properties:

In accordance with the advancement of the information-oriented society, there has been a strong demand for an advanced system for communication, which can transmit a larger amount of information more efficiently. At present, most of the transmission lines which connect households with telephone offices use an electronic transmission system (i.e., analog transmission by means of metal wires), so that the transmission capacity is small. Therefore, it is expected that, in the future, the transmission lines which connect house holds with telephone offices will be replaced by optical transmission lines using optical fibers. However, for realizing this, it is essential that the on/off switching of a flow of signals (which switching is effected in the electronic communication system by controlling the flow of electrons) can also be performed in the optical transmission lines using optical fibers. In other words, the development of an optical switch is necessary. In addition, for such an optical switch to be practically usable, it is necessary that the optical switch be provided in the form of a device which can simultaneously process a large number of individual flows of optical information coming from a large number of households. That is, it is necessary to develop a highly integrated optical switch device containing a large number of optical switches disposed at high density. Such a practical, optical switch device has not yet conventionally been developed. However, the functional element of the present invention can be provided as the desired highly integrated optical switch device. In an optical device in which the functional element of the present invention is used as an optical switch element, the high integration property can be realized, for example, by imparting optical switch function to each of the metal oxide needles (which are present at high density) of the functional element. Specifically, optical switch function can be imparted to each of the metal oxide needles in the functional element by a method in which the metal oxide needles are individually connected with a pair of electrodes (which are an anode and a cathode). The individual metal oxide needles can be operated as an optical switch as follows. An optical information signal is flowed through the needle (optical switch). For operating the optical switch, a voltage is applied across the pair of electrodes connected to the needle, to thereby change the phase of the wave of the optical information signal. The above-mentioned highly integrated optical switch device can be easily obtained by making use of the unique characteristics of the functional element of the present invention that the metal oxide needles are present at high density on the surface of the substrate. There is no particular limitation with respect to the type of the metal oxide used for forming the metal oxide needles in the functional element used as an optical switch device.

An optical device in which the functional element of the present invention is used as an optical switch element can be used as a highly integrated optical switch device in the field of optical communication, so that the optical device can meet the increasing demand accompanying the advancement of the information-oriented society, i.e., the demand for an advanced system for communication, which can transmit a larger amount of information more efficiently.

Representative examples of electric, electronic and optical devices in which the functional element of the present invention can be used are described above. Further examples of such devices to which the functional element is applicable include electric and electronic devices, such as an insulating material, an electroconductive material, a solid electrolyte, a fluorescent image display tube, an EL element, an actuator, a piezoelectric material, a thermistor, a varistor, a superconductive material, a thermoelectric heating/cooling element and an electromagnetic wave shielding material; optical devices, such as a photodielectric material, a light sensor, a solar battery, an optical modulator element and a light absorption filter. The functional element of the present invention has unique features that it comprises a substrate having on an upper surface thereof a plurality of metal oxide needles extending upwardly of the upper surface of the substrate, with their respective central axes arranged substantially in parallel with each other, wherein the metal oxide needles have a large surface area. By virtue of these properties, the functional element of the present invention can also be used in various other devices in addition to the above-mentioned devices. For example, when the metal oxide needles of the functional element of the present invention have a thickness (weighted average circle-based diameter) of 0.1 μm or less, preferably 0.05 μm or less, the functional element can be used as a thermoelectric heating/cooling element for a refrigerator or the like. Further, recently, studies have been made for using titanium oxide (in combination with a photosensitizer) in a wet type solar battery. In this connection, it should be noted that, when the metal oxide needles of the functional element of the present invention are comprised of titanium oxide, the functional element can be used for a solar battery. In such an application field, since the metal oxide needles in the functional element have a large surface area, a large area can be provided for receiving light energy. Therefore, a solar battery employing the functional element of the present invention exhibits an improved efficiency of the conversion of light into electricity.

BEST MODE FOR CARRYING OUT THE INVENTION

Hereinbelow, the present invention will be described in more detail with reference to the following Examples and Comparative Examples, which should not be construed as limiting the scope of the present invention.

In the following Examples and Comparative Examples, the leaning angles of the crystal axes (central axes) of metal oxide needles growing on a surface of a substrate are defined as angles at which the crystal axes lean away from a straight line extending in a direction vertical to the surface of the substrate.

EXAMPLE 1

Using a system as shown in FIG. 1, a functional element was produced as follows. Zinc acetylacetonate ($Zn(C_5H_7O_2)_2$) was charged into a metal compound-heating vessel. The vessel was heated to gasify the zinc acetylacetonate under conditions wherein the internal temperature of the vessel was 115° C. A single crystal plate ($Al_2O_3$) as a substrate, having a size of 10 mm×5 mm, was placed on a heater located just under a blow-off slit of a nozzle so that the (0001) face of the $Al_2O_3$ single crystal faced the slit. The substrate was heated to 550° C. by means of the heater. Dry nitrogen gas was introduced into the metal compound-heating vessel at a flow rate of 1.2 $dm^3$/min. The gasified zinc acetylacetonate in the vessel entrained by the nitrogen gas, was applied through the blow-off slit of the nozzle onto the surface of the $Al_2O_3$ single crystal plate under atmospheric pressure, thereby growing metal oxide (ZnO) needles on the surface of the substrate. 300 minutes after the start of the application, a functional element comprising the substrate and, grown on the surface thereof, a plurality of the metal oxide (ZnO) needles was obtained, which was then removed from the system.

Gold (an electroconductive substance) was vapor deposited on the functional element by sputtering at a thickness of 0.1 μm. Then, an observation of the functional element was conducted using a scanning electron microscope (hereinafter referred to simply as an "SEM").

Figure 2A:
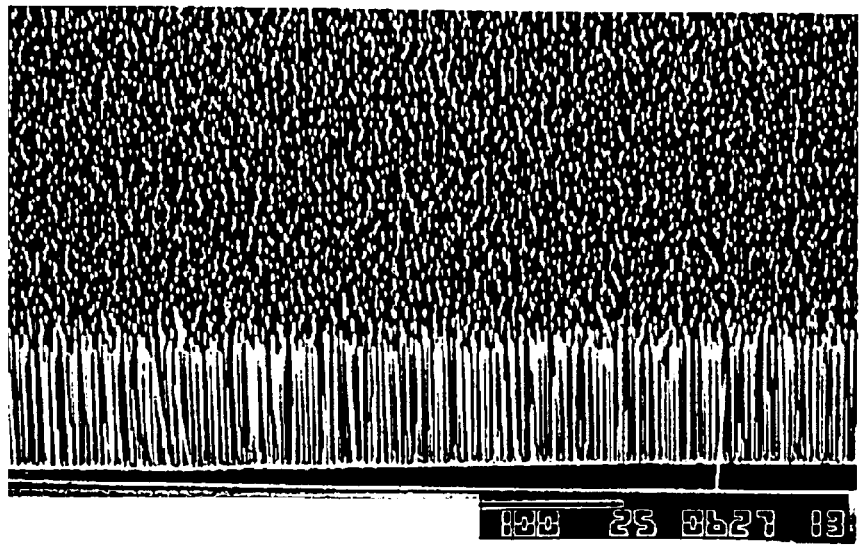
FIGS. 2(a) and 2(b) are photomicrographs taken by means of a scanning electron microscope (SEM), which show perspective views of the functional element produced in Example 1, wherein these two photomicrographs have different magnifications.
Figure 2B:
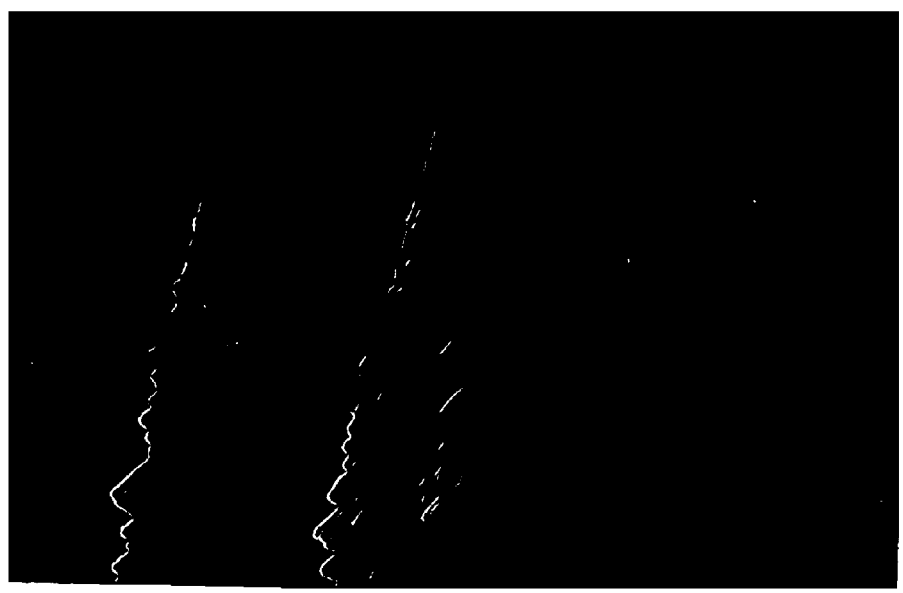

In order to elucidate the three-dimensional structure of the functional element, SEM photomicrographs showing perspective views of the obtained functional element were taken, and shown in FIGS. 2(a) and 2(b). The metal oxide (ZnO) needles had a weighted average circle-based diameter of 1.2 μm, a weighted average length of 100 μm and a density of 500 needles per unit area having a size of 10 μm×10 μm. Further, the leaning angles of the crystal axes of the metal oxide needles were each 0.9 degree.

EXAMPLE 2

A functional element was produced in substantially the same manner as in Example 1, except that the $Al_2O_3$ single crystal plate was heated to 600° C. and dry nitrogen gas was introduced into the metal compound-heating vessel at a flow rate of 2 $dm^3$/min.

Gold (an electroconductive substance) was vapor deposited on the functional element by sputtering at a thickness of 0.1 μm. Then, an observation of the functional element was conducted using an SEM.

Figure 3:
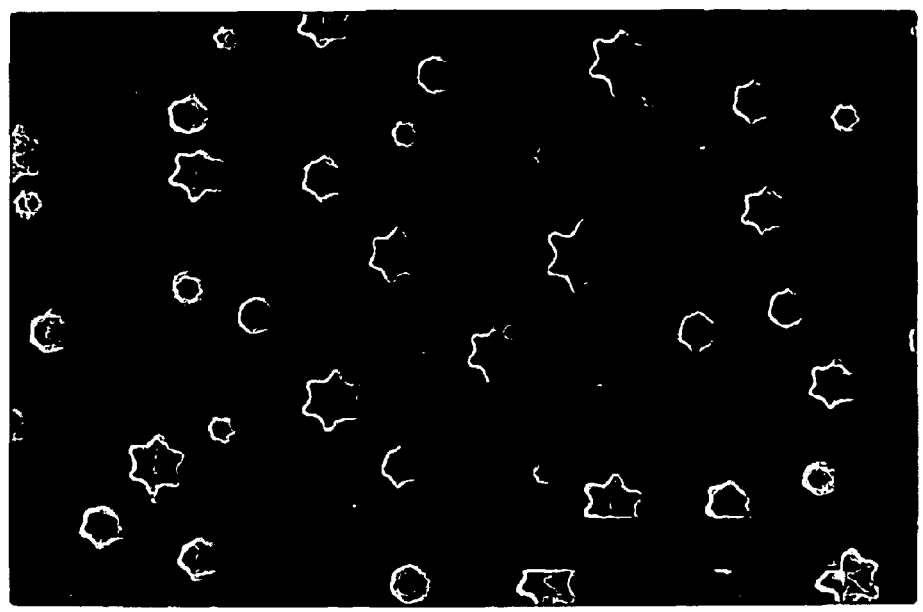
FIG. 3 is an SEM photomicrograph showing a plan view of the functional element produced in Example 2.

An SEM photomicrograph showing a plan view of the obtained functional element was taken, and shown in FIG. 3. The metal oxide (ZnO) needles had a weighted average circle-based diameter of 3.6 μm, a weighted average length of 80 μm and a density of 300 needles per unit area having a size of 10 μm×10 μm. Further, the leaning angles of the crystal axes of the metal oxide needles were each 0.8 degree.

EXAMPLE 3

Using the same system as in Example 1, a functional element was produced as follows. Tetraisopropoxytitanate ($Ti(OC_3H_7\text{-i})_4$) was charged into the metal compound-heating vessel. The vessel was heated to gasify the tetraisopropoxytitanate under conditions wherein the internal temperature of the vessel was 130° C. A single crystal plate (MgO) as a substrate, having a size of 10 mm×5 mm, was placed on the heater located just under the blow-off slit of the nozzle so that the (100) face of the MgO single crystal faced the slit. The substrate was heated to 450° C. by means of the heater. Dry nitrogen gas was introduced into the metal compound-heating vessel at a flow rate of 1.5 $dm^3$/min. The gasified tetraisopropoxytitanate in the vessel, entrained by the nitrogen gas, was applied through the blow-off slit of the nozzle onto the surface of the MgO single crystal plate under atmospheric pressure, thereby growing metal oxide ($TiO_2$) needles on the surface of the substrate. 30 seconds after the start of the application, a functional element comprising the substrate and, grown on the surface thereof, a plurality of the metal oxide ($TiO_2$) needles was obtained, which was then removed from the system.

Gold (an electroconductive substance) was vapor deposited on the functional element by sputtering at a thickness of 0.1 μm. Then, an observation of the functional element was conducted using an SEM.

Figure 4:
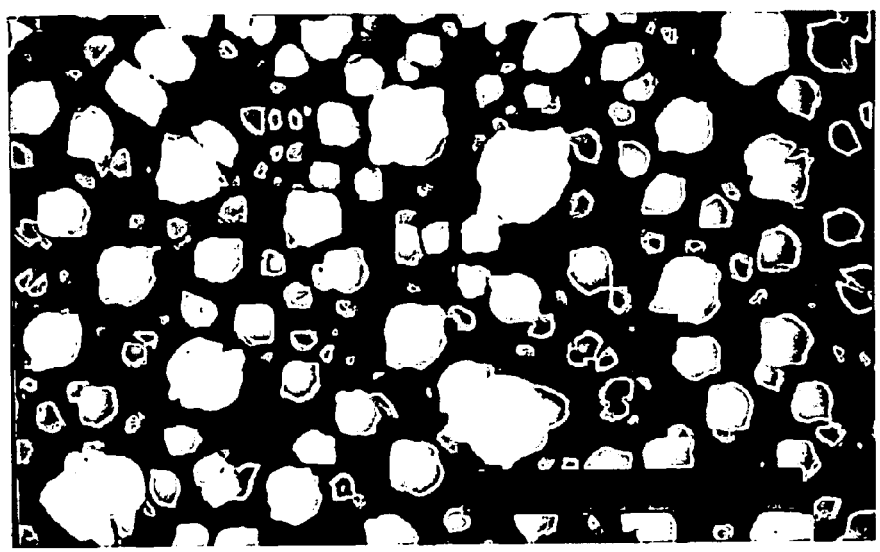
FIG. 4 is an SEM photomicrograph showing a plan view of the functional element produced in Example 3.

An SEM photomicrograph showing a plan view of the obtained functional element was taken, and shown in FIG. 4. The metal oxide ($TiO_2$) needles had a weighted average circle-based diameter of 0.8 μm, a weighted average length of 5 μm and a density of 2,500 needles per unit area having a size of 10 μm×10 μm. Further, the leaning angles of the crystal axes of the metal oxide needles were each 2.1 degrees.

EXAMPLE 4

An functional element was produced in substantially the same manner as in Example 3, except that the MgO single crystal plate was heated to 550° C.

Gold (an electroconductive substance) was vapor deposited on the functional element by sputtering at a thickness of 0.1 μm. Then, an observation of the functional element was conducted using an SEM.

Figure 5:
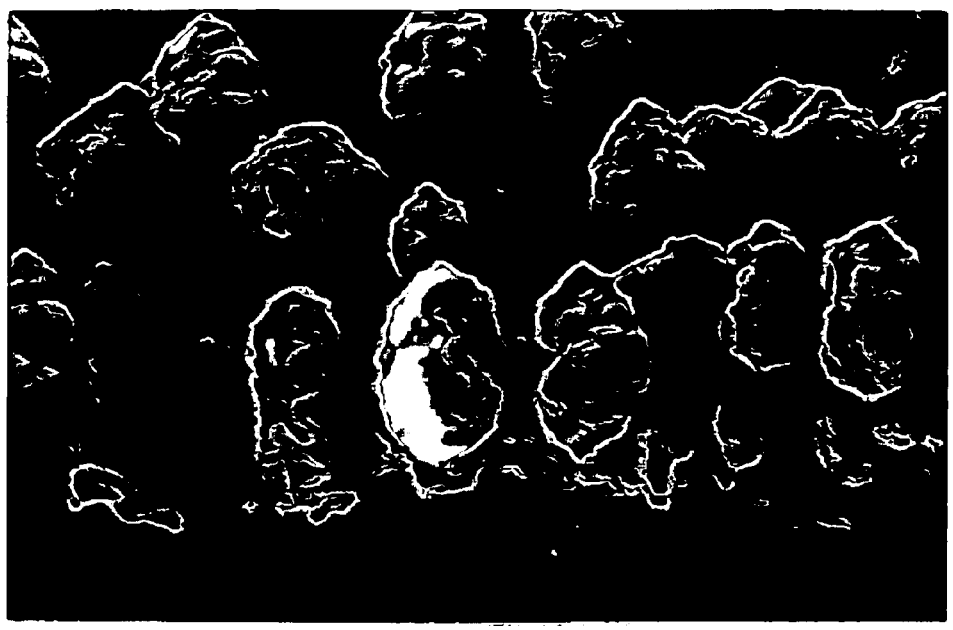
FIG. 5 is an SEM photomicrograph showing a perspective view of the functional element produced in Example 4.

In order to examine the three-dimensional structure of the obtained functional element, an SEM photomicrograph showing a perspective view of the functional element was taken, and shown in FIG. 5. The metal oxide ($TiO_2$) needles had a weighted average circle-based diameter of 0.8 μm, a weighted average length of 3 μm and a density of 3,200 needles per unit area having a size of 10 μm×10 μm. Further, the leaning angles of the crystal axes of the metal oxide needles were each 1.0 degree.

EXAMPLE 5

Using the same system as in Example 1, a functional element was produced as follows. Zinc acetylacetonate ($Zn(C_5H_7O_2)_2$) was charged into the metal compound-heating vessel. The vessel was heated to gasify the zinc acetylacetonate under conditions wherein the internal temperature of the vessel was 115° C. A silicon plate as a substrate, having a size of 10 mm×5 mm, was placed on the heater located just under the blow-off slit of the nozzle so that the (111) face of the silicon faced the slit. The substrate was heated to 550° C. by means of the heater. Dry nitrogen gas was introduced into the metal compound-heating vessel at a flow rate of 1.2 $dm^3$/min. The gasified zinc acetylacetonate in the vessel, entrained by the nitrogen gas, was applied through the blow-off slit of the nozzle onto the surface of the silicon plate under atmospheric pressure, thereby growing metal oxide (ZnO) needles on the surface of the substrate. 300 minutes after the start of the application, a functional element comprising the substrate and, grown on the surface thereof, a plurality of the metal oxide (ZnO) needles was obtained, which was then removed from the system.

Gold (an electroconductive substance) was vapor deposited on the functional element by sputtering at a thickness of 0.1 μm. Then, an observation of the functional element was conducted using an SEM.

Figure 6:
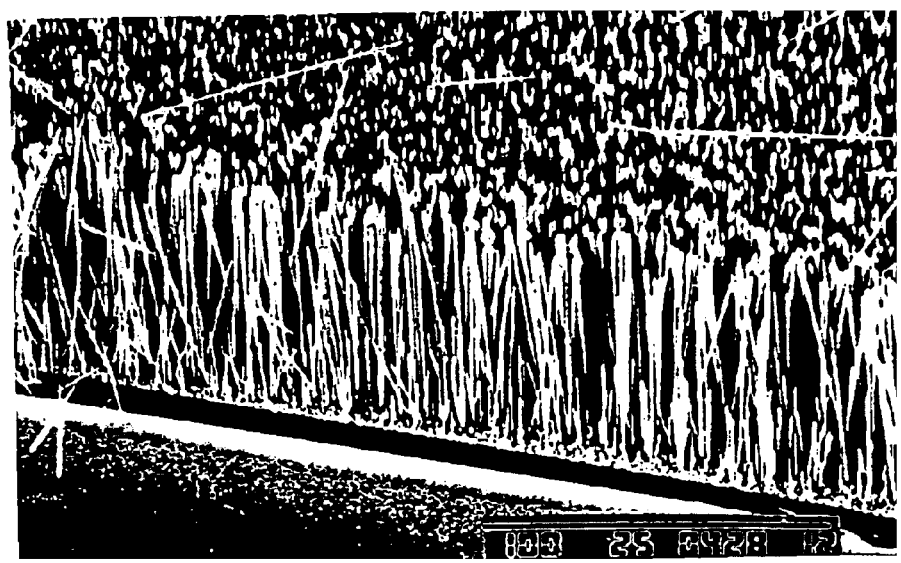
FIG. 6 is an SEM photomicrograph showing a perspective view of the functional element produced in Example 5.

In order to examine the three-dimensional structure of the obtained functional element, an SEM photomicrograph showing a perspective view of the functional element was taken, and shown in FIG. 6. The metal oxide (ZnO) needles had a weighted average circle-based diameter of 2.8 μm, a weighted average length of 70 μm and a density of 470 needles per unit area having a size of 10 μm×10 μm. Further, the leaning angles of the crystal axes of the metal oxide needles were each 3.9 degrees.

EXAMPLE 6

Using the same system as in Example 1, a functional element was produced as follows. Zinc acetylacetonate ($Zn(C_5H_7O_2)_2$) was charged into the metal compound-heating vessel. The vessel was heated to gasify the zinc acetylacetonate under conditions wherein the internal temperature of the vessel was 115° C. An $Al_2O_3$ single crystal plate as a substrate, having a size of 10 mm×5 mm, was placed on the heater located just under the blow-off slit of the nozzle so that the (0001) face of the $Al_2O_3$ single crystal faced the slit. The substrate was heated to 550° C. by means of the heater. Dry nitrogen gas was introduced into the metal compound-heating vessel at a flow rate of 1.2 $dm^3$/min. The gasified zinc acetylacetonate in the vessel, entrained by the nitrogen gas, was applied through the blow-off slit of the nozzle onto the surface of the $Al_2O_3$ single crystal plate under atmospheric pressure, thereby growing metal oxide (ZnO) needles on the surface of the substrate. 15 minutes after the start of the application, a functional element comprising the substrate and, grown on the surface thereof, a plurality of the metal oxide (ZnO) needles was obtained, which was then removed from the system.

Gold (an electroconductive substance) was vapor deposited on the functional element by sputtering at a thickness of 0.1 μm. Then, an observation of the functional element was conducted using an SEM.

Figure 7:
FIG. 7 is an SEM photomicrograph showing a perspective view of the functional element produced in Example 6.

In order to examine the three-dimensional structure of the functional element, an SEM photomicrograph showing a perspective view of the obtained functional element was taken, and shown in FIG. 7. The metal oxide (ZnO) needles had a weighted average circle-based diameter of 0.25 μm, a weighted average length of 0.5 μm and a density of 2,000 needles per unit area having a size of 10 μm×10 μm.

EXAMPLE 7 AND COMPARATIVE EXAMPLE

A functional element was produced in substantially the same manner as in Example 6. A circuit device (shown in FIG. 8) containing the functional element as an electron emission element was produced as follows.

The functional element (10 mm×5 mm), comprising an $Al_2O_3$ substrate (1) and ZnO needles (2), was fixed onto a silicon (Si) plate having a size of 15 mm×15 mm. The silicon plate having the functional element fixed thereonto was placed in a sputtering apparatus (SPF-332, manufactured and sold by ANELVA Corporation, Japan). A nickel sputtering was conducted under a pressure of 0.1 torr in an argon atmosphere for an hour to thereby form a nickel layer (3) having a thickness of 8 μm on the surface of the functional element and on the surface of the, exposed shoulder portion of the silicon plate having fixed thereonto the functional element. The functional element having the nickel layer on the surface thereof was used as an electron emission element as follows.

Figure 8:
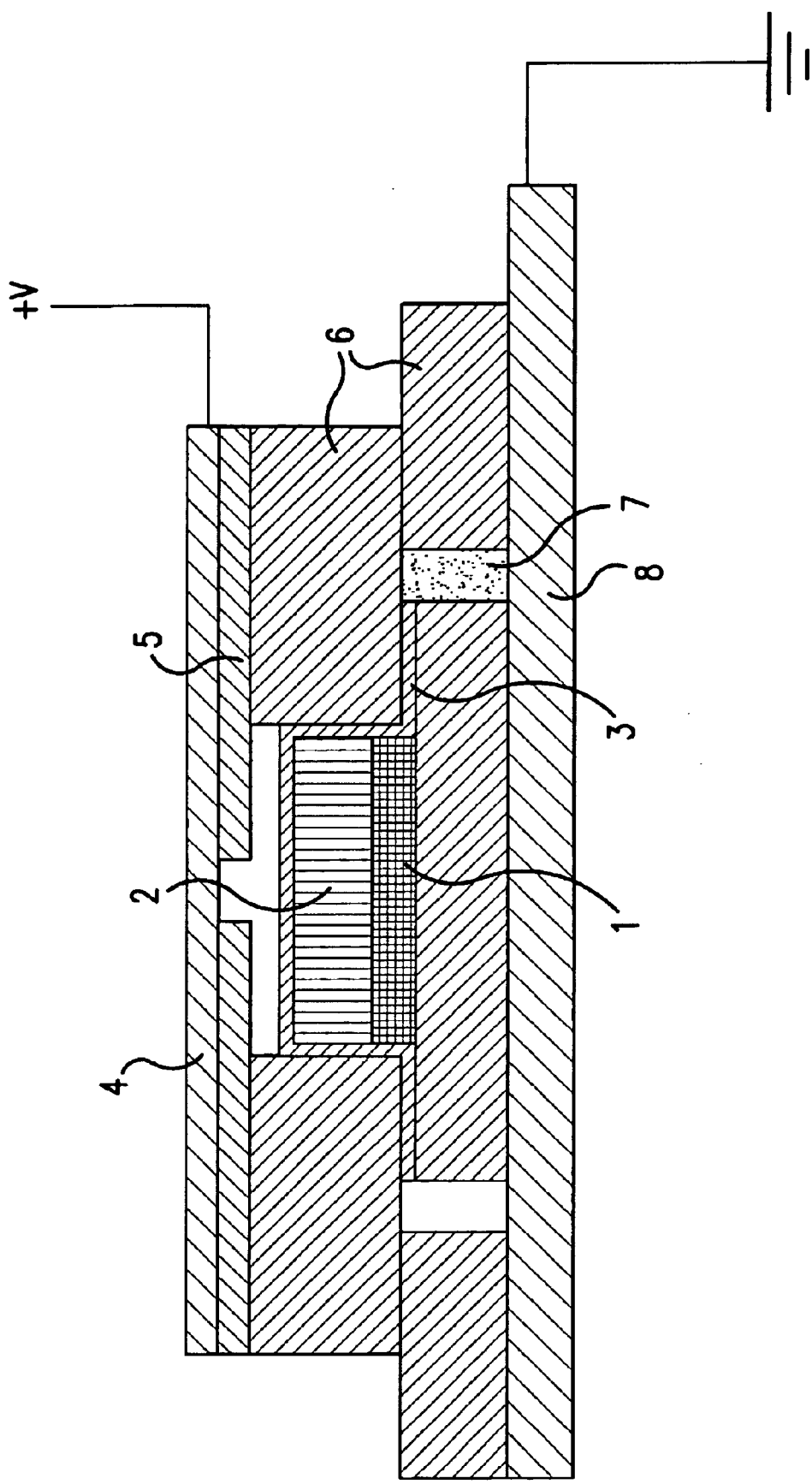
FIG. 8 is a vertical cross-sectional view of a circuit device which contains the functional element (shown in FIG. 7) produced in Example 6.

The electron emission element (fixed onto the silicon plate), silicon plates (6) as spacers, an electroconductive paste (7) and a copper plate (8) were assembled as shown in FIG. 8 so that the nickel layer (3) formed on the surface of the functional element and the copper plate (8) were connected with each other through the electroconductive paste (7). The copper plate (8) was connected with an external electrode, which was earthed. On the other hand, there was provided a copper plate (4) having a lower surface thereof coated with an insulating film (5) which has a square-shaped opening having a size of 2 mm×2 mm at the center of the film to thereby leave a non-coated portion in the lower surface of the copper plate (4). The copper plate (4) was connected with an external electrode, which in turn was connected with an anode. The copper plate (4) having the insulating film (5) coated on the lower surface thereof was fixed onto the upper surfaces of the silicon plates (6) placed on both sides of the functional element having the nickel layer (3) thereon so that the non-coated portion of the lower surface of the copper plate (4) faced the functional element having the nickel layer (3) thereon, wherein the distance between the non-coated portion of the lower surface of the copper plate (4) and the nickel layer (3) formed on the surface of the functional element became 0.5 mm. Thus, a circuit device was obtained having a vertical cross-sectional view shown in FIG. 8. This circuit device was provided for Example 7.

Another circuit device was produced in substantially the same manner as described above, except that a nickel plate having a size of 10 mm×5 mm×0.5 mm was used instead of the functional element having the nickel layer on the surface thereof. This circuit device was provided for Comparative Example.

The circuit device of Example 7 and the circuit device of Comparative Example were individually placed in a vacuum chamber. The internal pressure of the chamber was adjusted to $6 \times 10^{-6}$ torr. The anode and the earth were connected with each other through a current-voltage meter and a high voltage power source so that the current-voltage meter was positioned on the side of the anode and the high voltage power source was positioned on the side of the earth. Then, the electron emission was conducted and the emission current was measured.

In the circuit device of Example 7, in which the functional element of the present invention was used as an electron emission element, the emission current was as high as 5 $\mu$A when a voltage of 5 kV was applied across the anode and the earth. By contrast, in the circuit device of Comparative Example, in which the above-mentioned nickel plate was used instead of the functional element of the present invention, the emission current was as low as 0.4 $\mu$A when a voltage of 5 kV was applied across the anode and the earth.

INDUSTRIAL APPLICABILITY

The functional element of the present invention for use in an electric, an electronic or an optical device comprises a substrate having thereon a metal oxide structure comprised of a plurality of metal oxide needles and has an advantage in that, although the metal oxide structure comprised of the metal oxide needles has a very large surface area, the metal oxide structure has a very small thickness. The functional element of the present invention can be advantageously applied to various fields including the fields of elements for use in electric or electronic devices, such as an electron emission element of energy-saving type (i.e., an electron emission element having the capability of emitting electrons even under low voltages), a high-capacitance capacitor element, a high-density memory element and a high-sensitivity sensor element; and the fields of elements for use in optical devices, such as a laser emission element (particularly a laser emission element emitting a low-wavelength laser, such as an ultraviolet laser) and a highly integrated optical switch element. Also, by the method of the present invention, the functional element of the present invention can be effectively and efficiently produced without the need for a large equipment cost for the production. That is, in the method of the present invention, the production of the functional element can be conducted, for example, using a reaction zone containing air at atmospheric pressure.

What is claimed is:

1. A method for producing a functional element for use in an electric, an electronic or an optical device, which comprises:

(a) gasifying, at a temperature of from 30 to 600° C., at least one metal compound comprising a metal moiety and a non-metal moiety, said metal compound having volatilizability or sublimability and having the capability to react with at least one oxide-forming substance to form a metal oxide corresponding to said metal compound, to thereby obtain a metal compound gas, and (b) applying the obtained metal compound gas onto a surface of a substrate which is placed in a reaction zone containing said oxide-forming substance and which is heated to a temperature which is higher than the temperature of said metal compound gas and which is not higher than 800° C., to thereby contact the surface of said substrate with said metal compound gas in the presence of said oxide-forming substance for a period of time sufficient to grow a plurality of metal oxide needles on the surface of said substrate and form a functional element for use in an electric, an electronic or an optical device, said functional element comprising:

a substrate having on an upper surface thereof a plurality of metal oxide single crystal needles extending upwardly of the upper surface of said substrate, with their respective central axes arranged substantially in parallel with each other, said needles having a weighted average circle-based diameter of from 0.01 to 10,000 $\mu$m, wherein said weighted average circle-based diameter is defined as the weighted average diameter of circles having areas equal to the areas of the cross-sections of said needles, said cross-sections being taken at the middle portions located at the ½ lengths of said needles and along a plane perpendicular to the central axes of said needles, said needles having a weighted average aspect ratio of 0.1 or more, wherein said weighted average aspect ratio is defined as the ratio of the weighted average length of the needles to said weighted average circle-based diameter of the needles, said needles being present at a density of from 0.01 to 10,000 needles per unit area having a size of 10 $\mu$m×10 $\mu$m at the upper surface of said substrate.

2. The method according to claim 1, wherein, in step (b), said metal compound gas is applied together with a carrier gas.

3. The method according to claim 1, wherein said reaction zone contains air at atmospheric pressure.

4. The method according to claim 1, wherein the metal moiety of said metal compound is comprised of at least one element selected from the group consisting of elements belonging to Groups 1 to 15 of the Periodic Table, exclusive of hydrogen, boron, carbon, nitrogen, phosphorus and arsenic.

5. The method according to claim 1, wherein the metal moiety of said metal compound is comprised of at least one element selected from the group consisting of zinc, silicon, aluminum, tin, titanium, zirconium and lead.

6. The method according to claim 1, wherein said functional element is an electron emission element for use in an electric or an electronic device.

7. The method according to claim 1, wherein said functional element is a capacitor element for use in an electric or an electronic device.

8. The method according to claim 1, wherein said functional element is a memory element for use in an electric or an electronic device.

9. The method according to claim 1, wherein said functional element is a sensor element for use in an electric or an electronic device.

10. The method according to claim 1, wherein said functional element is a laser emission element for use in an optical device.

11. The method according to claim 1, wherein said functional element is an optical switch element for use in an optical device.

* * * * *

UNITED STATES PATENT AND TRADEMARK OFFICE
CERTIFICATE OF CORRECTION

PATENT NO. : 6,810,575 B1
DATED : November 2, 2004
INVENTOR(S) : Saito et al.

It is certified that error appears in the above-identified patent and that said Letters Patent is hereby corrected as shown below:

<u>Title page,</u>
Item [73], Assignee, should be listed as follows:
-- Asahi Kasai Chemicals Corportation, Tokyo (JP); Hidetoshi Saito, Niigata (JP) --.

Signed and Sealed this

Eighteenth Day of October, 2005

JON W. DUDAS
*Director of the United States Patent and Trademark Office*